US009225360B2

(12) United States Patent
Cideciyan et al.

(10) Patent No.: US 9,225,360 B2
(45) Date of Patent: *Dec. 29, 2015

(54) ITERATIVE DATA STORAGE READ CHANNEL ARCHITECTURE

(71) Applicant: GlobalFoundries U.S. 2 LLC, Hopewell Junction, NY (US)

(72) Inventors: Roy D. Cideciyan, Rueschlikon (CH); Robert A. Hutchins, Tucson, AZ (US); Thomas Mittelholzer, Zurich (CH); Sedat Oelcer, Kilchberg (CH)

(73) Assignee: GlobalFoundries Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/601,172

(22) Filed: Jan. 20, 2015

(65) Prior Publication Data

US 2015/0149860 A1 May 28, 2015

Related U.S. Application Data

(63) Continuation of application No. 13/907,736, filed on May 31, 2013, now Pat. No. 8,988,798.

(51) Int. Cl.
*H04L 1/00* (2006.01)
*H03M 13/37* (2006.01)
(Continued)

(52) U.S. Cl.
CPC ........... *H03M 13/3753* (2013.01); *G06F 11/10* (2013.01); *G06F 11/1076* (2013.01); *G11B 20/10268* (2013.01); *G11B 20/1833* (2013.01); *H03M 13/1102* (2013.01); *H03M 13/6325* (2013.01); *H03M 13/6331* (2013.01); *G11B 2020/185* (2013.01); *H03M 13/152* (2013.01); *H03M 13/1515* (2013.01); *H03M 13/41* (2013.01); *H03M 13/4138* (2013.01)

(58) Field of Classification Search
CPC ...................................................... H04L 1/0009
USPC .......................... 714/774, 764, 773, 759, 780
See application file for complete search history.

(56) References Cited

U.S. PATENT DOCUMENTS 6,268,824 B1 7/2001 Zhodzishky et al.
6,404,570 B1 6/2002 McNeil et al.
(Continued)

OTHER PUBLICATIONS

Barry et al., "Iterative Timing Recovery," 2004 IEEE, IEEE Signal Processing Magazine, Jan. 2004, pp. 89-102.
(Continued)

*Primary Examiner* — Fritz Alphonse

(57) ABSTRACT

In one embodiment, a computer program product for iterative read channel operation has program instructions embodied therewith that are executable by a controller to cause the controller to: in an iterative process until a maximum number of iterations has been reached or a valid codeword is produced: execute one or more digital front-end (DFE) functions on a plurality of signal samples employing the set of decisions provided by a decoder; execute a detection algorithm on the signal samples using a detector employing the set of decisions provided by the decoder to regenerate the set of decisions provided by a detector; execute a decoding algorithm of an error correcting code (ECC) using the set of decisions provided by the detector to regenerate the set of decisions provided by the decoder; and output decoding information relating to the signal samples when the decoding algorithm produces a valid codeword.

18 Claims, 13 Drawing Sheets

(51) Int. Cl.
   *G06F 11/10* (2006.01)
   *H03M 13/11* (2006.01)
   *G11B 20/10* (2006.01)
   *G11B 20/18* (2006.01)
   *H03M 13/00* (2006.01)
   *H03M 13/15* (2006.01)
   *H03M 13/41* (2006.01)

(56) References Cited

U.S. PATENT DOCUMENTS

| | | | |
|---|---|---|---|
| 7,394,608 | B2 | 7/2008 | Eleftheriou et al. |
| 7,495,854 | B2 | 2/2009 | Hutchins et al. |
| 7,716,561 | B2 * | 5/2010 | Belogolovyi et al. .......... 714/780 |
| 7,733,592 | B2 | 6/2010 | Hutchins et al. |
| 7,773,326 | B2 | 8/2010 | Hutchins et al. |
| 7,773,327 | B2 | 8/2010 | Hutchins et al. |
| 7,777,980 | B2 | 8/2010 | Hutchins et al. |
| 7,864,467 | B2 | 1/2011 | Eleftheriou et al. |
| 8,019,034 | B2 | 9/2011 | Hutchins et al. |
| 8,031,420 | B2 | 10/2011 | Mathew et al. |
| 8,156,400 | B1 | 4/2012 | Yeo et al. |
| 8,255,765 | B1 | 8/2012 | Yeo et al. |
| 8,458,563 | B2 * | 6/2013 | Sharon et al. .................. 714/763 |
| 8,964,321 | B2 | 2/2015 | Cideciyan et al. |
| 8,988,798 | B2 | 3/2015 | Cideciyan et al. |
| 2003/0037434 | A1 | 2/2003 | Osanai et al. |
| 2006/0067434 | A1 | 3/2006 | Kovintavewat et al. |
| 2009/0213484 | A1 | 8/2009 | Galbraith et al. |
| 2009/0296804 | A1 | 12/2009 | Marrow |
| 2011/0026154 | A1 | 2/2011 | Che et al. |
| 2012/0047396 | A1 | 2/2012 | Garani et al. |
| 2013/0173982 | A1 * | 7/2013 | Moon et al. .................... 714/752 |
| 2014/0355147 | A1 | 12/2014 | Cideciyan et al. |
| 2014/0355149 | A1 | 12/2014 | Cideciyan et al. |
| 2014/0359396 | A1 | 12/2014 | Cideciyan et al. |
| 2015/0109698 | A1 | 4/2015 | Cideciyan et al. |

OTHER PUBLICATIONS

Eleftheriou et al., "2.5 Recording Channel Electronics Technology," 2012 Information Storage Industry Consortium, International Magnetic Tape Storage Roadmap, May 2012, pp. 129-149.

Hu et al., "Iterative Coding for Patterned Media Recording," Intermag 2006, pp. 486.

Nayak, A. R., "Iterative Timing Recovery for Magnetic Recording Channels with Low Signal-to-Noise Ratio," A Thesis Presented to the Academic Faculty, In Partial Fulfillment of the Requirement for the Degree Doctor Philosophy, School of Electrical and Computer Engineering, Georgia Institute of Technology, Jun. 2004, pp. 1-179.

Olcer et al., "Global Timing Control with Applications to Tape Storage Channels," 2008 IEEE, IEEE "GLOBECOM" 2008 Proceedings, pp. 1-5.

Sarigoz et al., "Dropout-Tolerant Read Channels," 2001 IEEE, IEEE Journal on Selected Areas in Communications, vol. 19, No. 4, Apr. 2001, pp. 744-755.

Sarigoz et al., "Performance of dropout correction on real magnetic tape waveforms with dropouts," IEEE Transactions on Magnetics, vol. 37, No. 2, Mar. 2001, pp. 639-645, abstract only.

Tan et al., "Media Defect Recovery Using Full-Response Reequalization in Magnetic Recording Channels," 2008 IEEE, IEEE "GLOBECOM" 2008 Proceedings, pp. 1-5.

Tipton, L, "Read Channel Reconfiguration "On the Fly" to Read the Control Track Data on Optical Media," IPCOM000121077D, IBM Technical Disclosure Bulletin, vol. 34, No. 2, Jul. 1, 1991, pp. 291-292.

Xie et al., "Using Embedded Dynamic Random Access Memory to Reduce Energy Consumption of Magnetic Recording Read Channel," 2009 IEEE, IEEE Transactions on Magnetics, vol. 46, No. 1, Jan. 2010, pp. 87-91.

Final Office Action from U.S. Appl. No. 13/907,736, dated Jul. 31, 2014.

Notice of Allowance from U.S. Appl. No. 13/907,736, dated Nov. 3, 2014.

Non-Final Office Action from U.S. Appl. No. 13/907,759, dated Mar. 28, 2014.

Final Office Action from U.S. Appl. No. 13/907,759, dated Jul. 17, 2014.

Notice of Allowance from U.S. Appl. No. 13/907,759, dated Oct. 9, 2014.

Non-Final Office Action from U.S. Appl. No. 13/907,722, dated Nov. 6, 2014.

Non-Final Office Action from U.S. Appl. No. 13/907,736, dated Apr. 2, 2014.

Cideciyan et al., U.S. Appl. No. 13/907,736, filed May 31, 2013.
Cideciyan et al., U.S. Appl. No. 13/907,759, filed May 31, 2013.
Cideciyan et al., U.S. Appl. No. 13/907,722, filed May 31, 2013.
Cideciyan et al., U.S. Appl. No. 14/581,987, filed Dec. 23, 2014.

Non-Final Office Action from U.S. Appl. No. 14/581,987, dated Mar. 3, 2015.

Notice of Allowance from U.S. Appl. No. 13/907,722, dated Mar. 30, 2015.

Notice of Allowance from U.S. Appl. No. 13/907,722, dated Jun. 24, 2015.

Notice of Allowance from U.S. Appl. No. 13/907,722, dated Aug. 6, 2015.

Final Office Action from U.S. Appl. No. 14/581,987, dated Jul. 14, 2015.

Notice of Allowance from U.S. Appl. No. 14/581,987, dated Sep. 23, 2015.

* cited by examiner

ITERATIVE DATA STORAGE READ CHANNEL ARCHITECTURE

RELATED APPLICATIONS

This application is a continuation of U.S. patent application Ser. No. 13/907,736 filed May 31, 2013, which is herein incorporated by reference.

BACKGROUND

The present invention relates to data storage, and more particularly, to a data storage read channel architecture with reiterated digital front-end control.

The Information Storage Industry Consortium (INSIC) International Magnetic Tape Storage Roadmap reveals that areal recording densities are likely to exceed 50 Gbit/in$^2$ prior to 2023. Accordingly, future tape systems will need to operate their read channels at signal-to-noise ratio values that will be significantly (about two dBs) lower than those available in today's tape drives. Under these conditions, ensuring reliable read channel operation at error rates of $1\times10^{-17}$ or lower becomes an extremely challenging task.

Traditional approaches for achieving more reliable read channel operations, such as reducing the jitter noise in the timing recovery loop, detecting the presence of dropout events and attempting to mitigate their effects, or protecting data by more powerful Error Correction Coding (ECC) schemes, etc., also suffer from problems. These solutions fall short of providing the amount of robustness that is needed for reliable operations under the severely degraded conditions that may often prevail in future-generation tape storage systems.

Major difficulties arise in connection with signal timing recovery, typically, because the reliability of the data estimates driving the timing recovery loop at the projected low signal-to-noise ratio (SNR) operating condition is usually very poor. As a result, the readback signal is sampled at time instants that may deviate significantly from the ideal sampling instants. This in turn not only leads to a degradation of the read channel performance but also leads to the occurrence of cycle slips, which are temporary loss-of-lock events experienced by the phase-locked loop. Also, cycle slips may lead to severe performance degradation that may not even be remedied by error-correction coding, typically. In particular, occurrence of cycle slips may obliterate all the advantages associated with using powerful capacity-approaching coding, such as low-density parity-check (LDPC) coding.

Traditional approaches for combating cycle slips fall short of providing the amount of robustness that is needed for reliable operations under the severely degraded conditions that are likely to prevail in future-generation tape storage systems.

In addition, major difficulties also arise due to the presence of dropout events (dropouts). Dropouts may be attributed mainly to basefilm/back-coat formulation and asperities. Measurements have shown that dropout occurrence frequency increases with linear density and shrinking of the reader width. As a result, dropout events may lead to error bursts at the detector output. Maintaining symbol clock during a dropout is a major challenge, typically. Also, the severe performance degradation caused by dropouts may often not even be remedied by error-correction coding, typically. In particular, dropout events may obliterate all the advantages associated with using powerful capacity-approaching coding.

BRIEF SUMMARY

In one embodiment, a computer program product for iterative read channel operation includes a computer readable storage medium having program instructions embodied therewith, the program instructions executable by a controller to cause the controller to: store, by the controller, a block of signal samples to a memory, the signal samples being read from a magnetic tape, and execute, by the controller, one or more DFE functions on the block of signal samples employing a set of decisions provided by a detector executing a detection algorithm. The computer program product also includes program instructions executable by a controller to cause the controller to execute, by the controller, a decoding algorithm of an ECC on the signal samples using a decoder employing the set of decisions provided by the detector to generate a set of decisions provided by the decoder, store the signal samples, the set of decisions provided by the detector, and the set of decisions provided by the decoder, and in an iterative process until a maximum number of iterations has been reached or a valid codeword is produced: execute the one or more DFE functions on the signal samples employing the set of decisions provided by the decoder, execute the detection algorithm on the signal samples using the detector employing the set of decisions provided by the decoder to regenerate the set of decisions provided by the detector, execute the decoding algorithm of the ECC using the set of decisions provided by the detector to regenerate the set of decisions provided by the decoder, output decoding information relating to the signal samples when the decoding algorithm produces a valid codeword, and store the signal samples, the set of decisions provided by the detector, and the set of decisions provided by the decoder when the decoding algorithm does not produce a valid codeword.

In another embodiment, a computer program product for iterative read channel operation includes a computer readable storage medium having program instructions embodied therewith, the program instructions executable by a controller to cause the controller to: in an iterative process until a maximum number of iterations has been reached or a valid codeword is produced: execute, by the controller, one or more digital front-end (DFE) functions on a plurality of signal samples employing the set of decisions provided by a decoder; execute, by the controller, a detection algorithm on the signal samples using a detector employing the set of decisions provided by the decoder to regenerate the set of decisions provided by a detector; execute, by the controller, a decoding algorithm of an error correcting code (ECC) using the set of decisions provided by the detector to regenerate the set of decisions provided by the decoder; and output, by the controller, decoding information relating to the signal samples when the decoding algorithm produces a valid codeword.

Other aspects and embodiments of the present invention will become apparent from the following detailed description, which, when taken in conjunction with the drawings, illustrates by way of example the principles of the invention.

DETAILED DESCRIPTION

Figure 1:
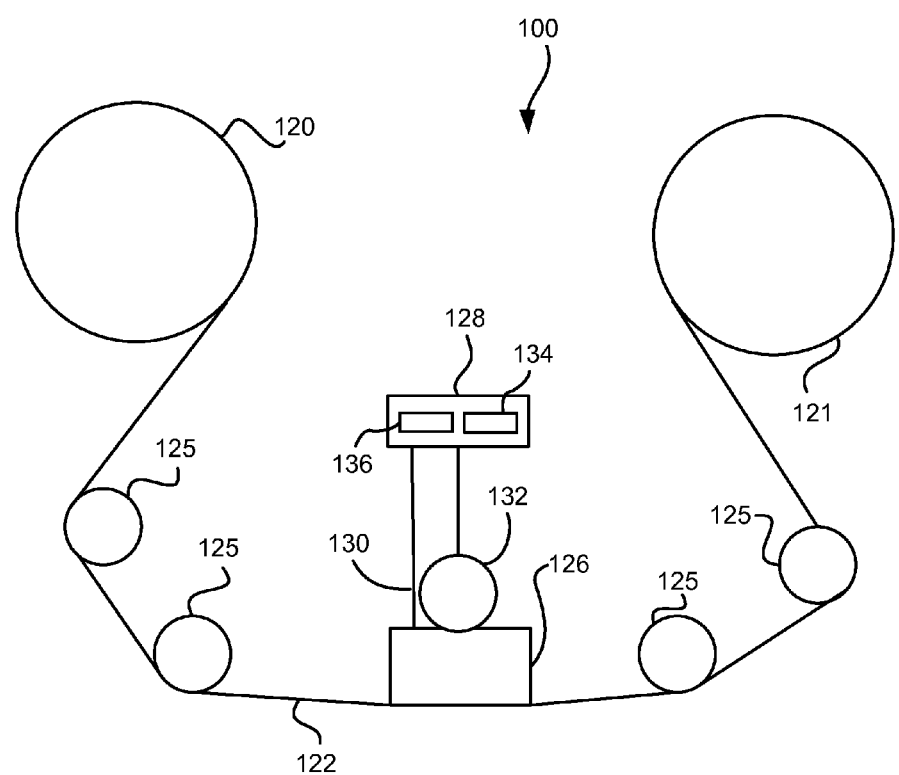
FIG. 1 illustrates a simplified tape drive of a tape-based data storage system, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

According to one embodiment, a magnetic medium's readback signal samples are processed more than once and thereby the performance of the read channel is iteratively improved. Iterative improvements are made possible because the decoder output decisions are fed back to the read channel front-end, where they are used to drive the decision-aided digital signal processing functions and control loops. Since data decisions provided by the decoder are usually much more reliable than those provided by the detector, a significant performance improvement is obtained. A more reliable operation of the digital front-end signal processing functions in turn allows improvements to the reliability of the decoded data. Usage of Error Correcting Code (ECC) schemes that are soft decodable makes the read channel technique, described according to various embodiments herein, particularly efficient. Note that conventional approaches base their signal processing functions on hard or soft detector decisions, which usually are much less reliable than decoder decisions.

In one general embodiment, a system for iterative read channel operation includes a processor and logic integrated with and/or executable by the processor, the logic being adapted to: execute one or more digital front-end (DFE) functions on a block of signal samples employing a set of decisions provided by a detector executing a detection algorithm, execute a decoding algorithm of an ECC on the signal samples using a decoder employing the set of decisions provided by the detector to generate a set of decisions provided by the decoder, store the signal samples, the set of decisions provided by the detector, and the set of decisions provided by the decoder, and in an iterative process until a maximum number of iterations has been reached or a valid codeword is produced: execute the one or more DFE functions on the signal samples employing the set of decisions provided by the decoder, execute the detection algorithm on the signal samples using the detector employing the set of decisions provided by the decoder to regenerate the set of decisions provided by the detector, execute the decoding algorithm of the ECC using the set of decisions provided by the detector to regenerate the set of decisions provided by the decoder, output decoding information relating to the signal samples when the decoding algorithm produces a valid codeword, and store the signal samples, the set of decisions provided by the detector, and the set of decisions provided by the decoder when the decoding algorithm does not produce a valid codeword.

In another general embodiment, a method for iterative read channel operation includes executing one or more DFE functions on a block of signal samples employing a set of decisions provided by a detector executing a detection algorithm, executing a decoding algorithm of an ECC on the signal samples using a decoder employing the set of decisions provided by the detector to generate a set of decisions provided by the decoder, storing the signal samples, the set of decisions provided by the detector, and the set of decisions provided by the decoder, and in an iterative process until a maximum number of iterations has been reached or a valid codeword is produced: executing the one or more DFE functions on the signal samples employing the set of decisions provided by the decoder, executing the detection algorithm on the signal samples using the detector employing the set of decisions provided by the decoder to regenerate the set of decisions provided by the detector, executing the decoding algorithm of the ECC using the set of decisions provided by the detector to regenerate the set of decisions provided by the decoder, outputting decoding information relating to the signal samples when the decoding algorithm produces a valid codeword, and storing the signal samples, the set of decisions provided by the detector, and the set of decisions provided by the decoder when the decoding algorithm does not produce a valid codeword.

According to another general embodiment, a computer program product for iterative read channel operation includes a computer readable storage medium having program code embodied therewith, the program code readable/executable by a processor to: execute one or more DFE functions on a block of signal samples employing a set of decisions provided by a detector executing a detection algorithm, execute a decoding algorithm of an ECC on the signal samples using a decoder employing the set of decisions provided by the detector to generate a set of decisions provided by the decoder, store the signal samples, the set of decisions provided by the detector, and the set of decisions provided by the decoder, and in an iterative process until a maximum number of iterations has been reached or a valid codeword is produced: execute the one or more DFE functions on the signal samples employing the set of decisions provided by the decoder, execute the detection algorithm on the signal samples using the detector employing the set of decisions provided by the decoder to regenerate the set of decisions provided by the detector, execute the decoding algorithm of the ECC using the set of decisions provided by the detector to regenerate the set of decisions provided by the decoder, output decoding information relating to the signal samples when the decoding algorithm produces a valid codeword, and store the signal samples, the set of decisions provided by the detector, and the set of decisions provided by the decoder when the decoding algorithm does not produce a valid codeword.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as "logic," a "circuit," a "module," or a "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a non-transitory computer readable storage medium. A non-transitory computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory, tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device, such as an electrical connection having one or more wires, an optical fiber, etc.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 illustrates a simplified tape drive 100 of a tape-based data storage system, which may be employed according to various embodiments. While one specific implementation of a tape drive is shown in FIG. 1, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 1, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically comprises a servo channel 134 and data channel 136 which includes data flow processing. It controls reel motion (not shown in FIG. 1) and head functions, such as track following, writing, reading, etc. The cable 130 may include read/write circuits to transmit data to the head 126 to be recorded on the tape 122 and to receive data read by the head 126 from the tape 122. An actuator 132 moves the head 126 to a set of tracks on the tape 122 in order to perform a write or a read operation.

An interface may also be provided for communication between the tape drive 100 and a host (integral or external) to send and receive the data and for controlling the operation of the tape drive 100 and communicating the status of the tape drive 100 to the host, as would be understood by one of skill in the art.

Error Correction Coding (ECC) is used in data storage to achieve very low bit error rates, e.g., magnetic tape storage products are designed to ensure bit error rates in the range of $1 \times 10^{-17}$ to $1 \times 10^{-19}$ under normal operating conditions. Linear block codes, such as Reed-Solomon (RS) codes and low-density parity-check (LDPC) codes, have generally been preferred ECC schemes used in data storage products.

Figure 2:
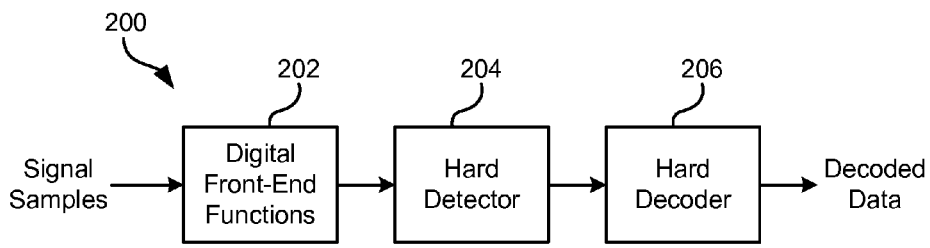
FIG. 2 shows a simplified prior art approach to read-channel design.

Now referring to FIG. 2, a prior art approach to read-channel design 200 includes driving the data-aided digital front-end (DFE) functions 202 (such as adaptive equalization, asymmetry cancellation, timing recovery, gain control, etc.) with decisions that are provided by one or more hard detectors 204 (feedback of the decisions from the detector 204 to the DFE functions 202 is not shown explicitly in FIG. 2). The hard detector 204 may be a slicer, a partial-response Viterbi detector, a noise-predictive maximum-likelihood (NPML) Viterbi detector, or any other suitable hard detector known in the art. After the hard detector 204, the signal is passed to a hard decoder 206 in order to produce decoded data.

Figure 3:
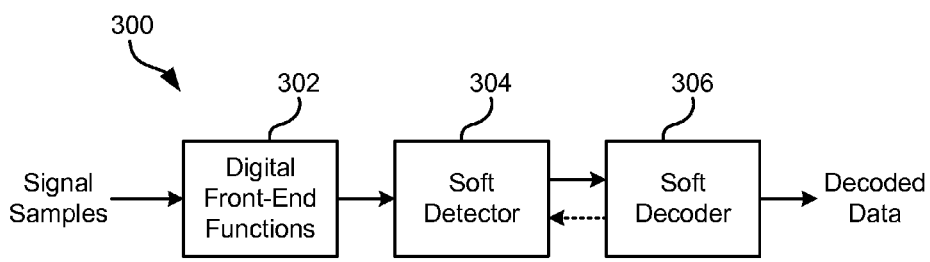
FIG. 3 shows a simplified prior art approach to read-channel design.

Performance of the prior art read-channel design 200 may be improved by replacing hard detection with soft detection, as shown in the read channel 300 of FIG. 3. As shown in FIG. 3, the DFE functions 302 are driven by decisions provided by the soft detector 304 (feedback of the decisions from the soft detector 304 to the DFE functions 302 is not shown explicitly in FIG. 3). Because soft decisions provide in general reliability information, enhanced performance of the front-end functions 302 is achieved. The introduction of soft detection by the soft detector 304 also allows for reliability information to be provided to a soft decoder 306. The feedback arrangement shown in FIG. 3 shows the soft detector 304 and soft decoder 306 working in an iterative mode, as is well known to those skilled in the art.

Figure 4:
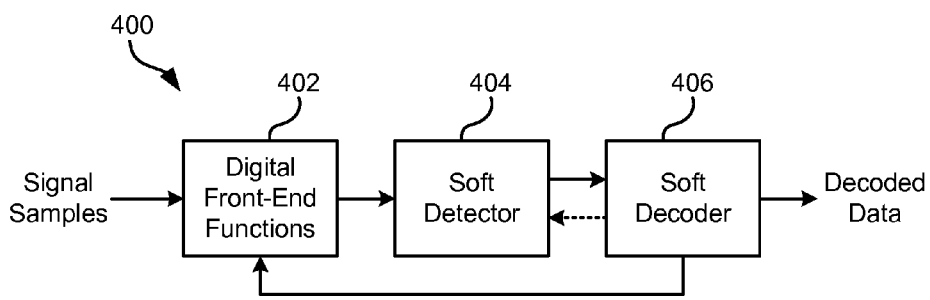
FIG. 4 shows a simplified approach to read-channel design, according to one embodiment.

Now referring to FIG. 4, soft decoder 406 decisions may be exploited in performing potentially all the DFE functions 402 in a read channel 400 because they are typically much more reliable than hard or soft detector 404 decisions. Hence, the read channel 400 has DFE functions 402 which are driven by decisions provided by the soft decoder 406. Note that decisions provided by a hard decoder (206, FIG. 2) may also be fed back to the DFE section (402, FIG. 4). However, since the soft detector 404/soft decoder 406 arrangement is usually significantly more powerful (in terms of error rate performance) than the hard detection/decoding structure, the advantages of the read channel 400 in FIG. 4 is significantly more pronounced when the decisions fed back are those provided by the soft decoder 406.

A major impediment to implementing the read channel 400 may be due to large processing delay, or loop delay, that is incurred by soft detection and soft decoding. However, this difficulty is totally removed by operating the read channel 400 in an iterative manner as described herein according to various approaches. The principle of the iterative channel operation is explained in more detail with regard to FIG. 5.

Figure 5:
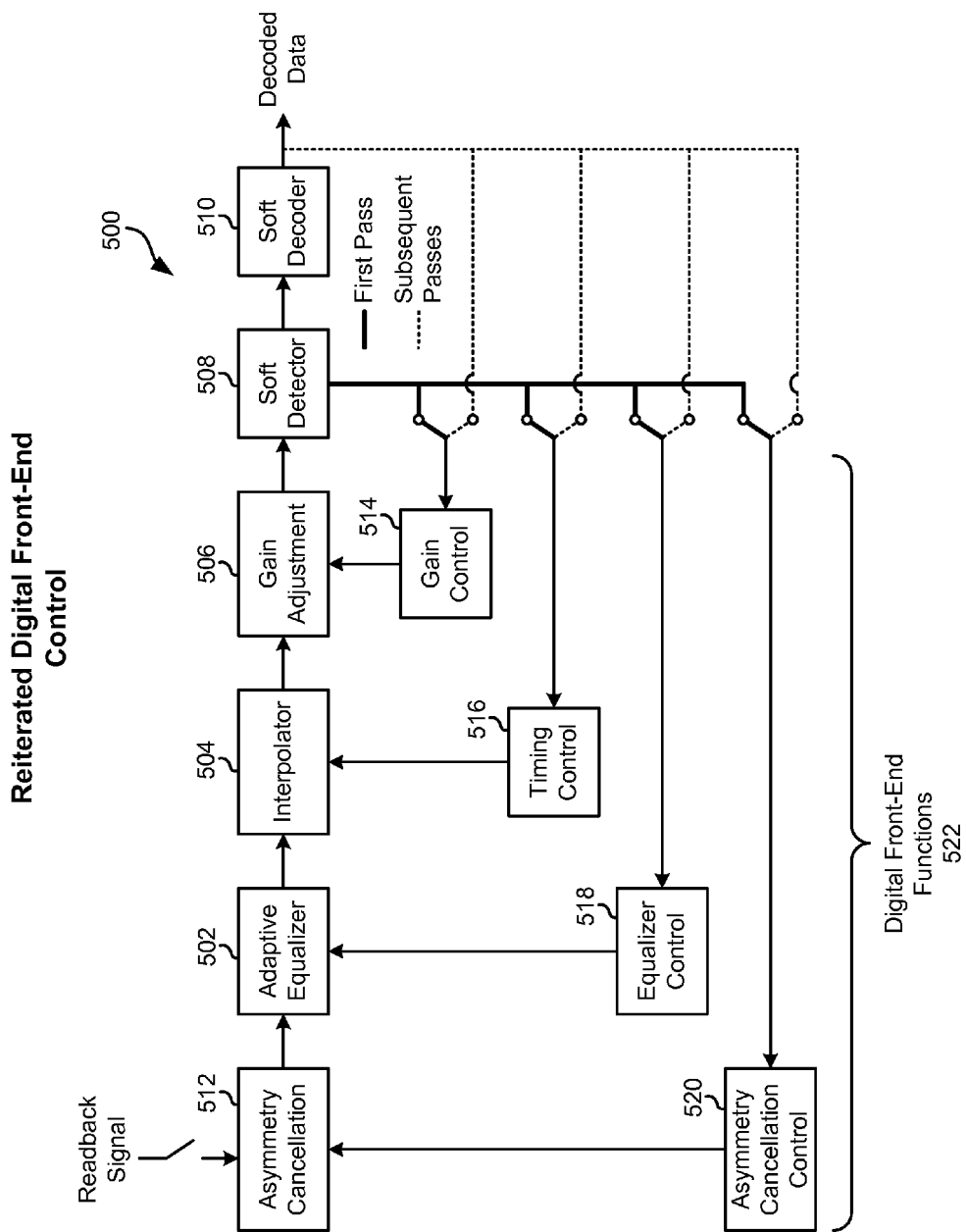
FIG. 5 shows a system for reiterated digital front-end control, according to one embodiment.

In FIG. 5, a receiver with reiterated digital front-end control (RRFEC) is shown according to one embodiment. The reiterated digital front-end control is shown for a read channel 500. Some of the digital front-end functions 522 which may utilize reiterated control include, but are not limited to, asymmetry cancellation 512, adaptive equalization 502, interpolation 504, gain adjustment 506, etc. Other front-end functions 522 may also have reiterated control, as would be understood by one of skill in the art upon reading the present descriptions. In addition, the ordering of these front-end functions 522 is not limited to the order shown in FIG. 5; instead, the front-end functions 522 may have any ordering, such as having the gain adjustment 506 before the interpolator 504, the interpolator 504 first followed by the adaptive equalizer 502, etc.

Each of the individual front-end functions 522 has a control loop associated therewith: the gain adjustment 506 loop has gain control 514, the interpolator 504 loop has timing control 516, the adaptive equalizer 502 loop has equalizer control 518, and the asymmetry cancellation 512 loop has asymmetry cancellation control 520. Other front-end functions 522 would likewise have some function incorporated in a loop for iterative processing. The storage of decoded data is not shown explicitly in FIG. 5, but may be incorporated in the read channel 500, as would be understood by one of skill in the art.

During the first pass through the read channel 500, feedback is provided for each control loop via the soft detector 508. In each subsequent pass through the read channel 500 after the first pass, feedback is provided for each control loop via the soft decoder 510. As stated previously, data decisions provided by the soft decoder 510 are usually much more reliable than those provided by the soft detector 508. Therefore, performance improvements may be anticipated due to this read channel 500 design.

In some approaches, the reiterated read channels 500 described herein may have architectural features different from those specifically shown in the figures. One feature is a sampling device for the readback signal, such as an A/D converter or some other suitable function block, which may sample the readback signal under the control of a phase-locked loop. In the architecture described in FIG. 5, it is assumed that the sampling process is controlled neither in frequency nor in phase (fixed-rate sampling). Hence, in this arrangement, read channel iterations are related to functions following the A/D conversion. In particular, if timing control 516 is reiterated, this iteration is performed at the interpolator 504 level, not at the A/D converter level.

In another approach, the adaptive equalizer 502 may operate in asynchronous mode, i.e., prior to the interpolator 504 (and likewise, prior to timing control 516). The adaptive equalizer 502 may deliver signal samples nominally separated by m·T/n seconds, where T denotes the duration of a bit recorded on the tape medium and m and n are independent positive integers, such as 1, 2, 3, 4, 5, 10, 100, etc., in several embodiments. In another embodiment, m and n may be relatively prime numbers. The interpolator 504 performs timing recovery and generates signal samples that are nominally T-spaced, according to one embodiment.

However, in another embodiment, the reiterated receiver disclosed herein may adopt an architecture where adaptive equalization 502 is performed following interpolation in the interpolator 504. In that case, an adaptive equalizer 502 with so-called fractional tap spacing may be employed (this adaptive equalizer offers some advantages compared to adaptive equalizers with nonfractionally tap spacing, such as being less sensitive to aliasing effects), taking p·T/q-spaced samples and releasing T-spaced samples. Again, p and q are independent positive integers, such as relatively prime numbers, which may be suitably chosen by one of skill in the art to obtain a desired effect and achieve satisfactory receiver performance, e.g., they are chosen to minimize mean square error and simplify implementation in one approach.

Figure 6:
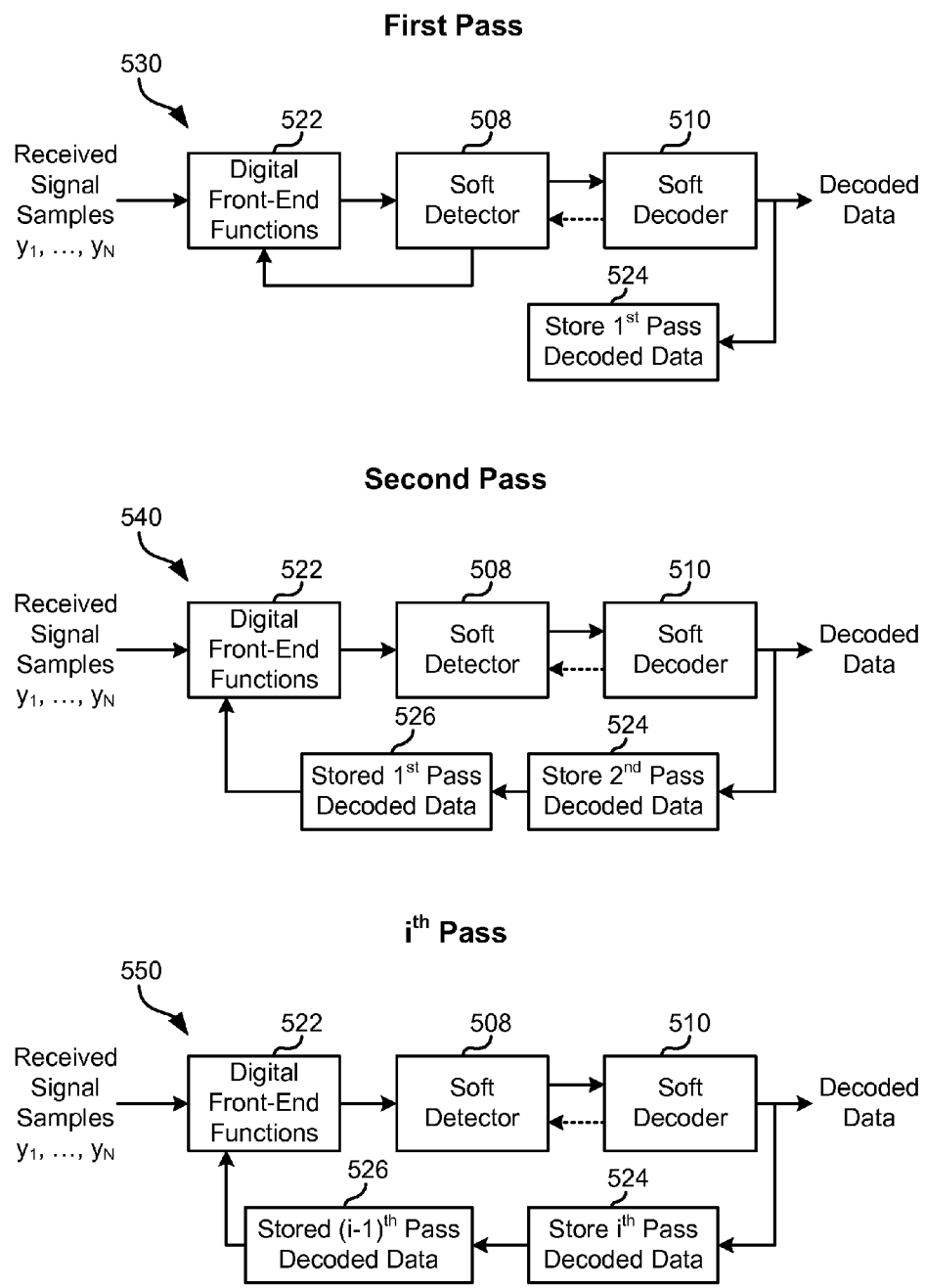
FIG. 6 shows a more detailed description of the system for reiterated digital front-end control, according to one embodiment.

Now referring to FIG. 6, a more detailed description of the iterative control is given. During the first pass, the read channel 530 operates in a "conventional" manner. The read channel 530 is shown for the first pass, where received signal samples $y_1, \ldots, y_N$, are provided to the digital front-end functions 522, which process the signal samples using feedback from the soft detector 508 (i.e., the digital front-end functions 522 are driven by decisions provided by the soft detector 508), and outputs to the soft detector 508. The soft detector provides an output to the soft decoder 510 (which may have a feedback loop with the soft detector 508) which then provides the decoded data, from which first pass decoded data 524 may be stored.

This first pass is used to process a block of N input signals $y_1, \ldots, y_N$, and produces a set of decoded data, which is stored in a buffer as shown.

In the second pass shown in read channel 540, data buffer 524 outputs first pass decoded data to data buffer 526 and the digital front-end functions 522 receive the signal samples along with the stored first pass decoded data 526, and outputs the processed signal to the soft detector 508. The soft detector 508 outputs decisions and the signal to the soft decoder 510, which then outputs the decoded data, from which the second pass decoded data 524 may be stored. This second pass through the read channel 540 represents each subsequent pass (after the first pass) as well, as shown in read channel 550 for the $i^{th}$ pass.

In the second pass read channel 540, the same signal samples $y_1, \ldots, y_N$ as in the first pass are processed but the digital front-end functions 522 are now driven by the decoded data generated during the first pass 526. This data has much higher reliability than the data that would be provided by the detector 508. At the end of each subsequent pass ($i^{th}$), a new set of decoded data is generated and stored again in a buffer. This data is used to drive the front-end functions 522 during the $i+1^{th}$ pass. This iterative procedure is repeated as many times as needed, desired, programmed, or otherwise stipulated.

The read channel 550 for the $i^{th}$ pass depicts two buffers (524, 526) to illustrate that during the $i^{th}$ pass, decoded data for the $i^{th}$ pass is written into one buffer 524 and decoded data for the $i-1^{th}$ pass is read from another buffer 526. In another embodiment, a single buffer where data is written into and read from the same buffer may alternatively be used.

This iterative read channel architecture is powerful because it does not ignore error correction coding (ECC) in executing the digital front-end functions 522 and avoids any problems associated with loop delay.

For soft detection in the soft detector 508, any one or more of a number of known algorithms may be used, including the Bahl-Cocke-Jelinek-Raviv (BCJR) algorithm, the dual-max algorithm, the soft-output Viterbi algorithm (SOVA), etc. The ECC scheme may employ soft decodable codes, such as low-density parity-check (LDPC) codes, turbo codes, or any other soft-decodable capacity-approaching code. Hence, the soft decoder 510 may employ any one or more of a number of algorithms known for decoding the employed code.

In a read channel with soft ECC decoding, decoding of the modulation code using a modulation decoder (not shown) usually takes place after soft ECC decoding, but is not so limited, and may take place before the soft ECC decoding. In the former case, reverse concatenation is employed.

Note that if the iterative read channel relies on hard-decoded data, as mentioned previously, then any powerful hard-decodable ECC scheme may be used, such as Reed-Solomon (RS) coding, Bose-Chaudhuri-Hocquenghem (BCH) coding, etc.

Furthermore, in a read channel with hard ECC decoding, decoding of a modulation code using a modulation decoder (not shown) may take place before or after the hard ECC decoder. Modulation decoding adds latency in the receive path but, since buffered data is used during the second and subsequent passes, loop delay due to modulation decoding does not impact system performance.

In one embodiment, a modulation code of the signal samples may be decoded subsequent to executing the detection algorithm and prior to executing the decoding algorithm of the ECC. Then, a modulation code may be encoded on the set of decisions provided by the decoder 510 prior to executing the DFE functions 522 thereon.

Different strategies may be followed in implementation of the iterative read channel, according to various approaches. For example, a fixed number of iterations (passes) may be performed, and at the end of the fixed number of passes, the decoded data is used as is. Alternatively, iterations may be performed only when decoding fails (e.g., in the case where LDPC coding is used, when the parity-check matrix "does not check" for the decoded LDPC codeword). In another approach, iterations may be performed until a predetermined threshold or confidence level is achieved, at which point the process is ended and the decoded data is output.

Figure 7:
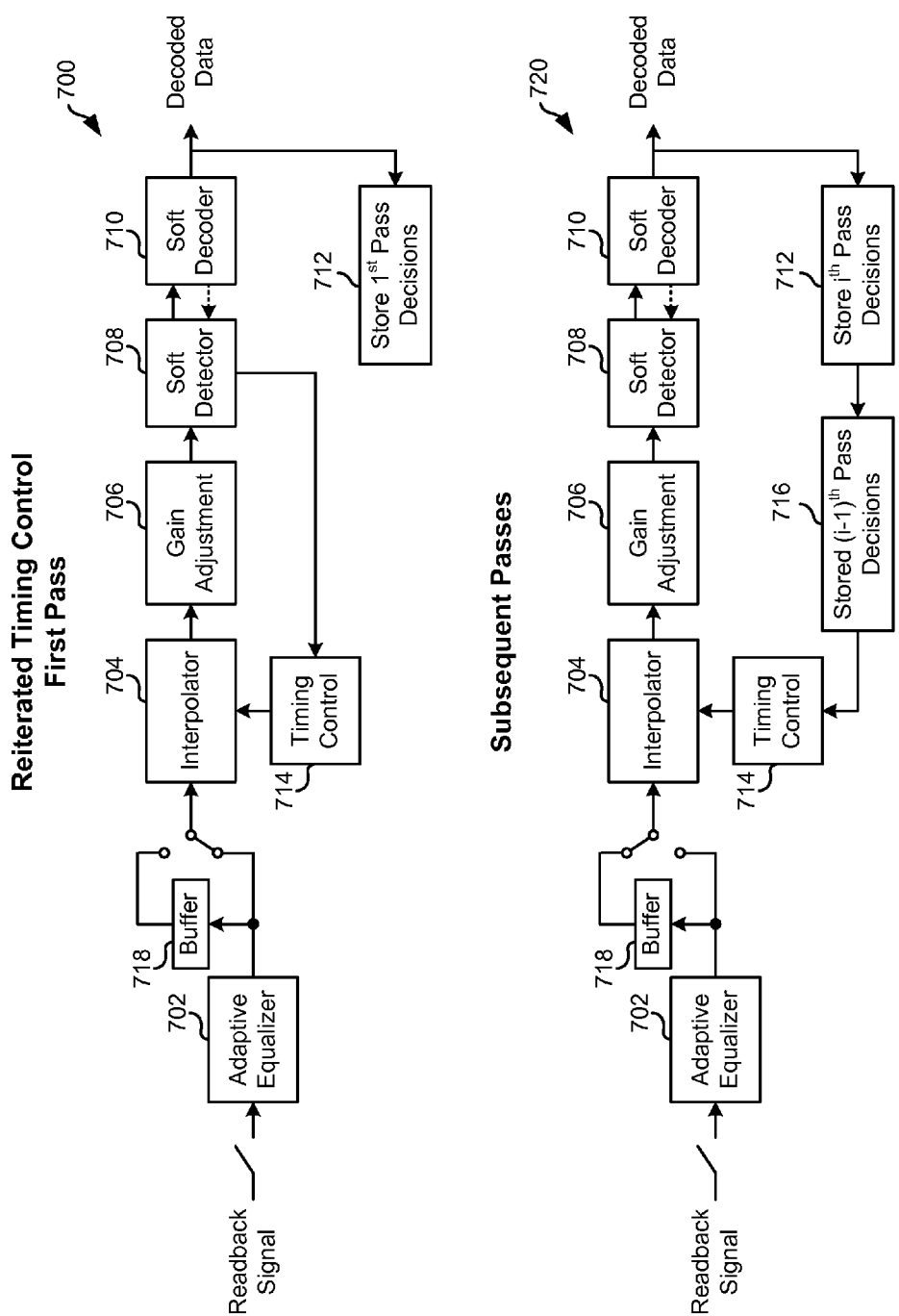
FIG. 7 shows a system for reiterated timing control according to one embodiment.

With reference to FIG. 7, reiterated timing control is described according to one embodiment. The read channel 700 for the first pass shows the readback signal being fed to the adaptive equalizer 702. After being processed by the adaptive equalizer 702, the signal may be stored in a buffer 718 and simultaneously pass through to the interpolator 704. The exact position of the signal buffering function within the receive chain depends on which front-end functions are reiterated within the read channel.

The interpolator 704 receives an output from the timing control 714 loop, which utilizes decisions from the soft detector 708. The output from the interpolator is sent to the gain adjustment 706 for processing, then the soft detector 708, followed by the soft decoder 710, which produces the decoded data. The first pass decisions 712 for the decoded data are stored, allowing them to be used in the subsequent pass.

The subsequent $i^{th}$ pass read channel 720 is similar to the first pass read channel 700, except that the stored $(i-1)^{th}$ pass decisions 716 are utilized by the timing control 714, instead of the decisions from the soft detector 708. In addition, the $i^{th}$ pass decisions 712 are stored to a buffer, which in the next pass will become the $(i-1)^{t1}$ pass decisions 716.

Timing control 714 in a conventional (nonreiterated) read channel is well known to those skilled in the art. A common approach to timing control is based on the Mueller-Muller timing function, where timing error at time k, denoted as $\hat{\epsilon}_k$, is estimated by evaluating the following equation.

$$\hat{\epsilon}_k = x_k \hat{s}_{k-1} - x_{k-1} \hat{s}_k$$

In this equation, $x_k$ is the signal sample at time k after gain adjustment 706 and $\hat{s}_k$ is a slicer or sequence detector decision on the signal $x_k$. In the iterative read channel, at the $i^{th}$ iteration, $\hat{s}_k$ is a signal decision based on decoder decisions obtained at iteration $(i-1)$.

For example, for an EPR4 channel, with the binary (hard) decisions provided by the decoder at the end of iteration i denoted as $\hat{a}_k$, the slicer or sequence detector decision $\hat{s}_k$ may be combined using the following equation.

$$\hat{s}_k = \hat{a}_k + \hat{a}_{k-1} - \hat{a}_{k-2} - \hat{a}_{k-3}$$

As one of skill in the art would understand, a hard decision value $\hat{s}_k$ may also be replaced by a soft decision value $\tilde{s}_k$. For example, for $\tilde{a}_k$, a soft decision on the bit $a_k$, the soft decision $\tilde{s}_k$ may be obtained using the following equation.

$$\tilde{s}_k = \tilde{a}_k + \tilde{a}_{k-1} - \tilde{a}_{k-2} - \tilde{a}_{k-3}$$

In this equation, the soft decision $\tilde{a}_k$ may be generated by a soft ECC decoder, or some other suitable decoder.

In a situation where global timing control is applied where timing information of two or more channels are combined to generate global timing information (e.g., a global frequency estimate) and then used by each individual channel, reiterated timing control may also be applied. In these situations, during the $i^{th}$ iteration, the timing information generated by each channel is decoder-decision based, and global information is similarly computed and distributed to every individual channel. For more information of global timing control in a multichannel architecture, reference is made to U.S. Pat. Nos. 7,733,592; 7,773,326; 7,773,327; 7,777,980; and 8,019,034.

Figure 8:
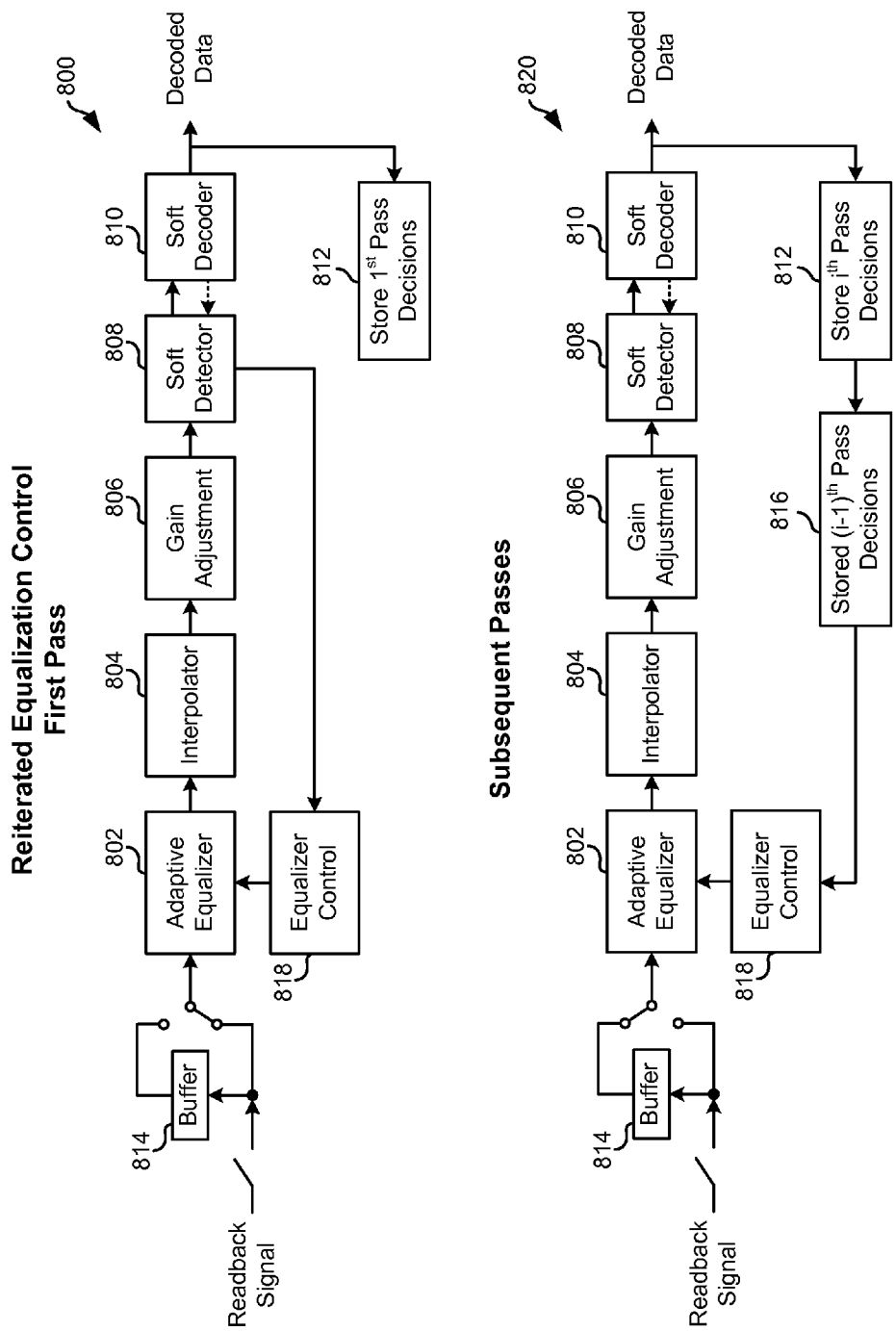
FIG. 8 shows a system for reiterated equalization control according to one embodiment.

As shown in FIG. 8, a read channel 800 for a first pass includes an adaptive equalizer 802, an interpolator 804, gain adjustment 806, a soft detector 808, a soft decoder 810, and memory to store first pass decisions 812. A buffer 814 may also be included to store the readback signal for use in reiterations of one or more digital front-end functions. In FIG. 8, adaptive equalization is reiterated in the adaptive equalizer 802, and the buffer 814 is provided in the read channel 800 before the adaptive equalizer 802. Although in FIG. 8 only the adaptive equalization is shown as being reiterated, timing control, interpolation, gain adjustment, and/or any other front-end functions may be reiterated, but this is not shown explicitly in the figure.

During the first pass, the first pass decisions 812 are stored, and the equalizer control 818 relies on decisions from the soft detector 808.

In read channel 820 for subsequent passes after the first pass, the equalizer control 818 relies on the stored $(i-1)^{th}$ pass decisions 816, while the current $(i^{th})$ pass decisions 812 are stored to a memory.

Figure 9:
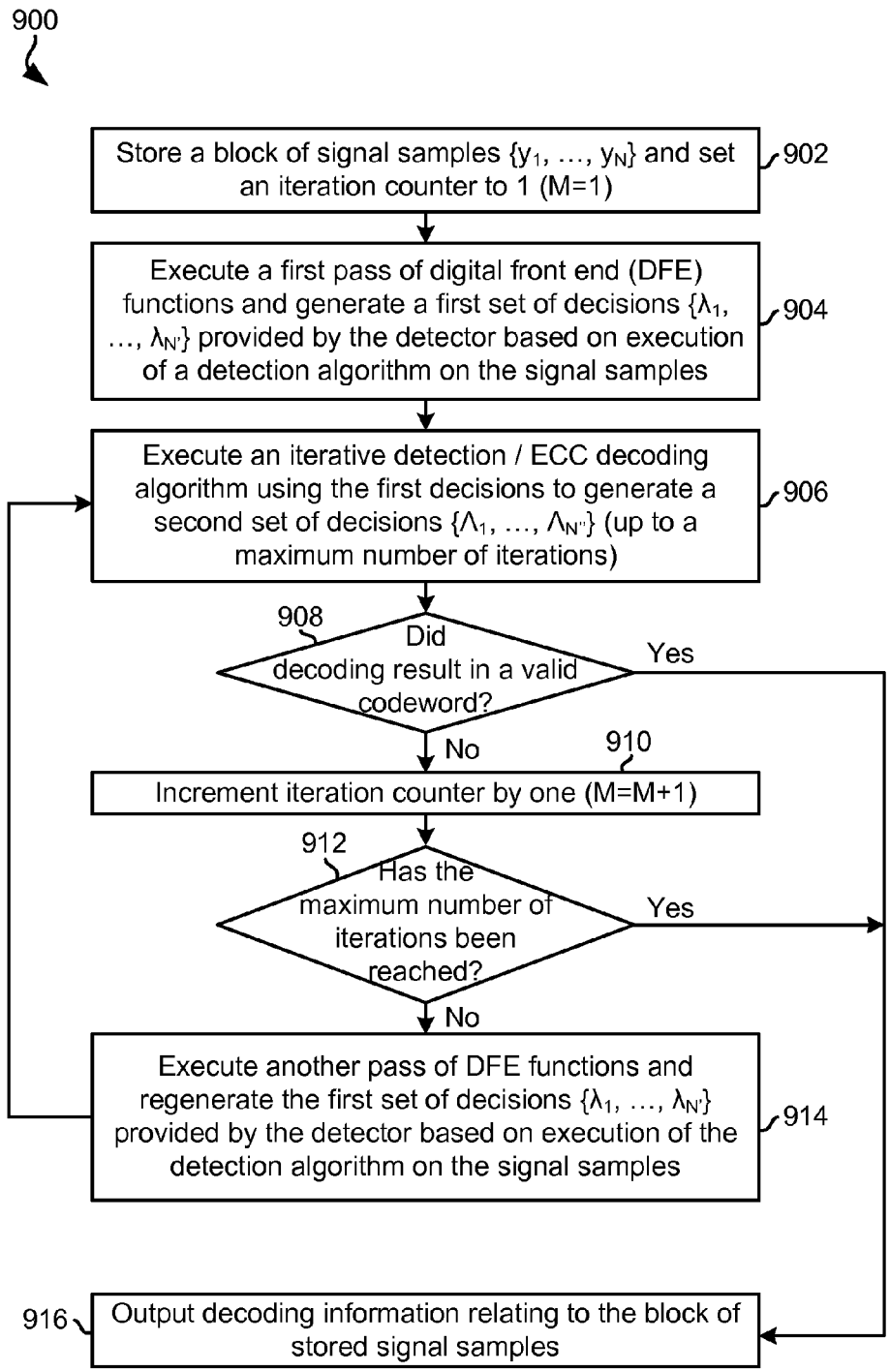
FIG. 9 is a flowchart of a method according to one embodiment.

Now referring to FIG. 9, the operation of an iterative read channel may be described with the aid of a flow chart diagram of a method 900, according to one embodiment. The method 900 may be performed in accordance with the present invention in any of the environments depicted in FIGS. 1-8, and 10-16, among others, in various embodiments. Of course, more or less operations than those specifically described in FIG. 9 may be included in method 900, as would be understood by one of skill in the art upon reading the present descriptions.

Each of the steps of the method 900 may be performed by any suitable component of the operating environment. For example, in various non-limiting embodiments, the method 900 may be partially or entirely performed by an encoding/decoding system, a tape drive, a hard disk drive, an optical drive, a processor (such as a CPU, an ASIC, a FPGA, etc.) which may be embedded in and/or operate within a system, etc.

As shown in FIG. 9, method 900 may initiate with operation 902, where a block of signal samples $\{y_1, \ldots, y_N\}$, where N, in one approach, is related to the number of bits in an ECC codeword, N", are stored to a memory (such as a buffer) and an iteration counter is set to 1 (M=1). In one approach, N=N"T/T', where T/T' is an oversampling factor. In other approaches, any method or system of tracking a number of iterations may be used, and the iteration counter is simply an example of one such method. The block of signal samples may have a size, N, that is different from N"T/T', as required by a specific implementation, such as an implementation employing modulation encoding in standard concatenation or an implementation feeding back a plurality of ECC codewords to the DFE functions during the iterative process, and the signal samples may be the samples of a readback waveform from any type of media, such as magnetic tape, optical disk, magnetic disk, etc.

In operation 904, DFE functions are executed in a first pass on the signal samples employing a first set of decisions $\{\lambda_1, \ldots, \lambda_{N'}\}$ provided by a detector based on execution of a detection algorithm on the signal samples, where N'=NT'/T.

The detector may be a hard detector or a soft detector, and may produce corresponding hard or soft decisions.

In operation 906, an iterative detection/ECC decoding algorithm is executed by a detector and a decoder using the first decisions to generate a second set of decisions $\{\Lambda_1, \ldots, \Lambda_{N''}\}$ where N"=N' when modulation encoding in standard concatenation is not used, i.e., reverse concatenation is used (the standard order of first ECC encoding and then modulation encoding is reversed) or modulation encoding is not used at all, and N"=N'R when rate-R modulation encoding in standard concatenation is used. The decoder may be a hard decoder or a soft decoder, and may produce corresponding hard or soft decisions. This iterative detection/ECC decoding algorithm is executed up to a maximum number of iterations, or until a valid codeword is produced.

In one embodiment, where a soft detector and a soft decoder are being used, method 900 may include repeating execution of the detection algorithm and the decoding algorithm for a predetermined number of iterations in an attempt to procure a valid codeword prior to re-executing the DFE functions on the signal samples. In this way, time and processing may be saved if a valid codeword is produced through the iterative detection/decoding algorithm without re-executing the entire DFE functions at operation 914 and "starting over."

In operation 908, it is determined whether the decoding resulted in a valid codeword. In various embodiments, a valid codeword may be a codeword which has an acceptable number of errors and/or erasures therein, depending on the decoding scheme (erasure decoding, error decoding, etc.) and the error tolerance. When a valid codeword has been produced, the method 900 continues to operation 916 to output decoded information. Otherwise, the method 900 continues to operation 910.

In operation 910, the iteration counter is incremented by one (M=M+1) in order to indicate that another iteration of processing is going to occur. However, if in operation 912 it is determined that the maximum number of iterations has been reached, possibly based on the iteration counter, method 900 continues to operation 916 to output current decoded information. Otherwise, the method 900 continues to operation 914 to process another pass or iteration on the signal samples to attempt to achieve a valid codeword.

In operation 914, another pass of DFE functions are executed on the signal samples using the second set of decisions, and the first set of decisions are regenerated based on execution of the detection algorithm on the signal samples in the detector.

In this way, more accurate decisions are being provided to the DFE functions than the detector decisions, thereby resulting in more accurate results from the DFE functions, which should lead to a better chance of a valid codeword being produced.

In one embodiment, when using a multi-channel recording with L channels, cycle slip pointers may be included in the DFE function execution as additional reliability side-information for the combination logic of the global timing control. In particular, the cycle-slip pointers may provide a conservative reliability weighting of the phase/frequency errors of the L channels. This will substantially increase the accuracy of the combination logic and result in improved timing recovery. The cycle slip pointers may also indicate a starting point and a length of the cycle slip event.

Once operation 914 is performed, the method 900 returns to operation 906 to begin another iteration of processing.

In operation 916, decoding information relating to the block of signal samples is output. In one embodiment, the decoding information may include information bits, a number of erasures, a location of erasures, etc.

The method 900 may be executed in a system, apparatus, computer program product, or in any other way known in the art. In one such embodiment, a system may include a processor (such as a CU, an ASIC, a FPGA, etc.) and modules (such as an ECC decoder, a hard or soft detector, a multiplexer, etc.), code, and/or logic (soft or hard) enabled to execute the steps of the method 900 or portions thereof. The logic may be integrated with the processor and/or executable by the processor. In another embodiment, a computer program product may include a computer readable storage medium having program code embodied therewith, the program code readable/executable by the processor to execute the method 900 or portions thereof.

In order to combat cycle-slip events, a read channel may be employed that uses a RRFEC. To combat cycle slips in the best possible manner, the RRFEC architecture based read channel first attempts to detect the occurrence of cycle-slip events. One possibility here is to exploit cycle-slip side information derived from coding constraints. Other efficient cycle slip detection techniques may also be used at this stage. The RRFEC architecture allows reprocessing blocks of readback signals and thereby offers the possibility of acting many times on these signals to mitigate cycle slip occurrences.

Another advantage of embodiments described herein is that the delay problem in the detection of cycle slips is avoided (in a non-iterative approach, the read channel may typically attempt to detect and at the same time combat cycle slips; the need for very fast detection schemes makes such schemes very unreliable). Therefore, a first pass may be devoted to detecting the occurrence of cycle-slip events, while subsequent passes may aim at mitigating and taking corrective actions against such detected events.

In various embodiments, a single channel constellation as well as a multi-channel constellation may be used for the read channel. In a multi-channel constellation, the proposed technique is particularly effective because a weak channel may strongly benefit from timing side-information from other strong channels.

The cycle-slip problem may be described using the following equation, which represents the readback waveform.

$$y(t) = \sum_k a_k h(t - kT - \tau_k) + n(t), a_k \in \{\pm 1\}$$

In this equation, $h(t-kT-\tau_k)$ is the received pulse, $n(t)$ is the noise process, and $\tau_k$ is the sampling phase offset parameter. Optimally, the received pulse may be sampled at time instants $\{kT\}$.

A cycle slip occurs when the timing loop fails to track and the phase-locked loop (PLL) slips one or more cycles with respect to the correct sampling phase. Dynamics of phase change, loop bandwidth, and reliability of decisions affect the cycle-slip sensitivity of the PLL. As a result of a cycle slip, the detector will insert/delete one or more bits into/from the detected data sequence. In the case of a cycle slip, synchronization is temporarily lost, and for this reason, cycle slips may also be referred to as sync slips.

Figure 10:
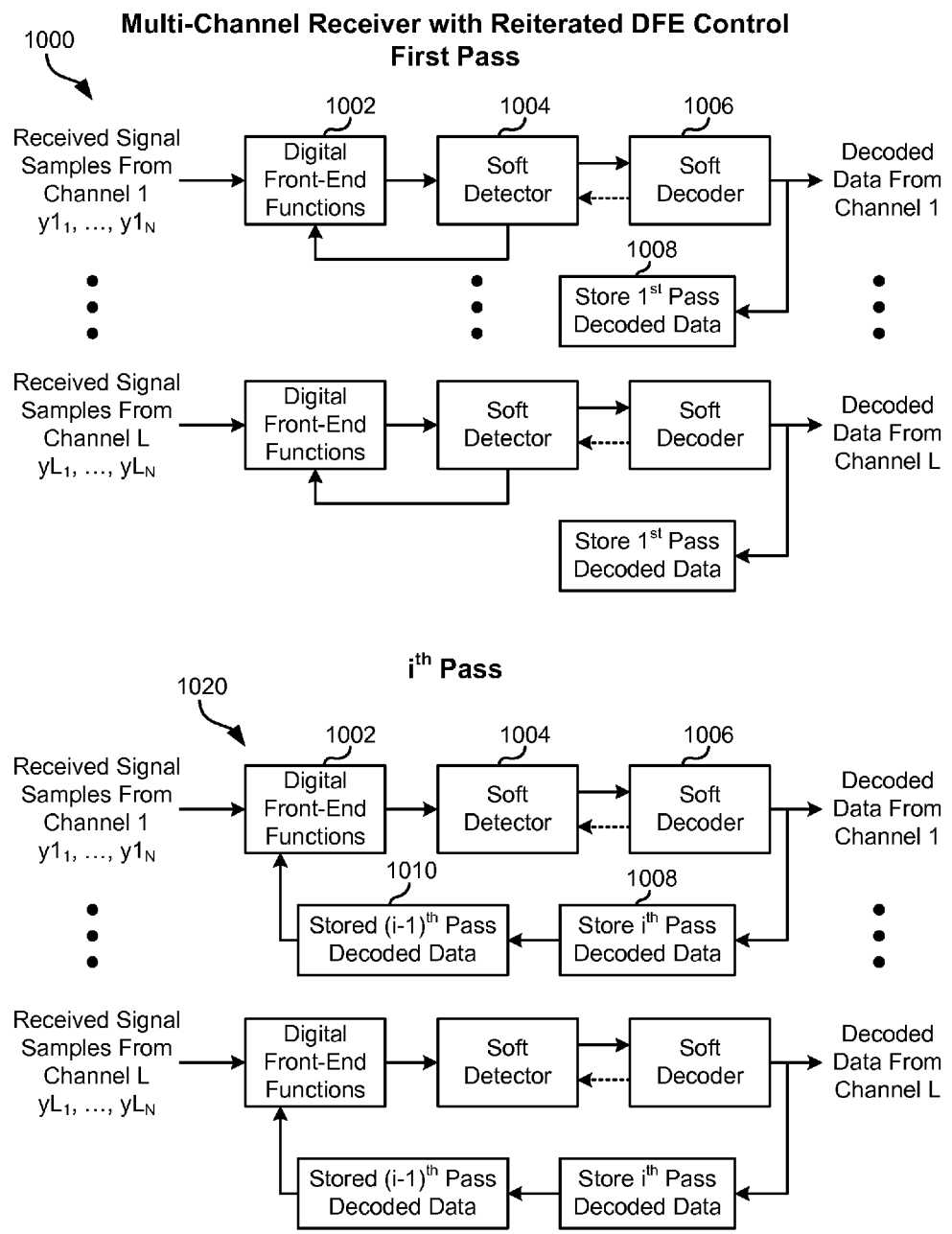
FIG. 10 shows a multi-channel receiver with reiterated digital front-end control, according to one embodiment.

Now referring to FIG. 10, a multi-channel RRFEC is shown for a first pass 1000 and for each subsequent $i^{th}$ pass 1020, according to one embodiment. As shown, signal samples from a plurality of channels (Channel 1, Channel 2, . . . , Channel L) are received and DFE functions 1002 are performed thereon for each individual channel. In the receiver for the first pass 1000, the decisions from the plurality of soft detectors 1004 are used in the plurality of DFE functions 1002, while the decisions (decoded data) from the plurality of soft decoders 1006 are stored in a plurality of memories for the $i^{th}$ pass decoded data 1008.

Then, as shown in the receiver for each subsequent $i^{th}$ pass 1020, the stored $(i-1)^{th}$ pass decoded data 1010 is used by the plurality of DFE functions 1002, while the $i^{th}$ pass decoded data 1008 are stored to a plurality of memories for use in the next pass, if needed. This process is performed for each individual channel, from Channel 1 to Channel L, so that decoded data is provided for each individual channel.

In one exemplary embodiment, timing control may be reiterated for cycle slip mitigation. As one of skill in the art would understand, any DFE function may be reiterated, alone or in concert with the reiteration of other DFE functions, in order to form a more robust read channel. Clearly, the DFE functions that are involved in this iterative scheme may be all the decision-aided functions or, alternately, only a subset of one or more of the DFE functions.

Figure 11:
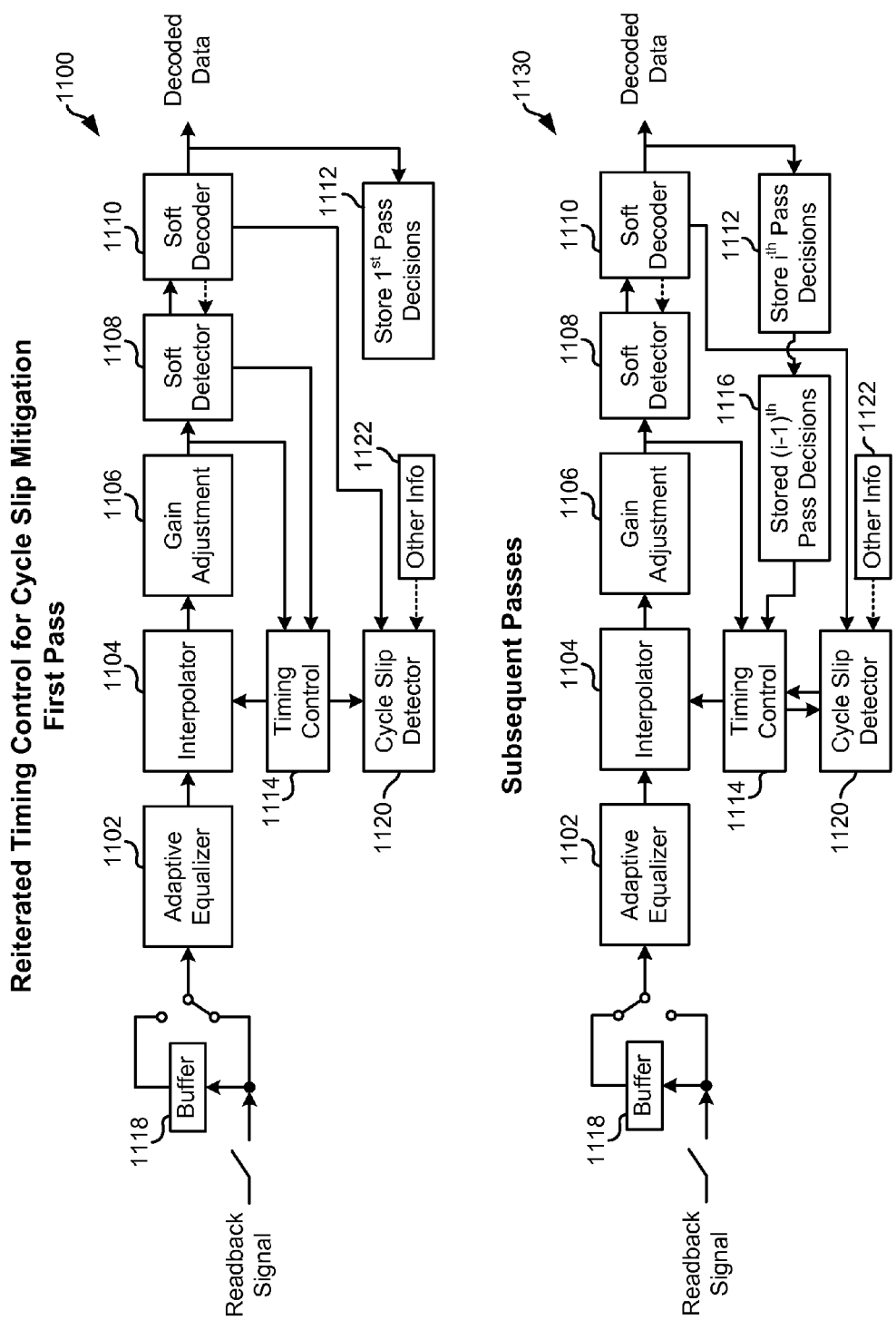
FIG. 11 shows a system for reiterated timing control for cycle slip mitigation, according to one embodiment.

With reference to FIG. 11, a receiver with reiterated timing control for cycle slip mitigation is shown for a first pass 1100 and for each subsequent $i^{th}$ pass 1130, according to one embodiment.

The readback signal may be sampled in an asynchronous manner while recovery of the correct sampling time instants is performed purely digitally by interpolation at the interpolator 1104. The block diagram shows, in a simplified manner, the principle of feeding the interpolator 1104 by decoder decisions for the iterations performed after the first pass. As shown, during the first pass, the read channel 1100 operates in a "conventional" manner and cycle-slip detection is performed in the cycle slip detector 1120.

The read channel 1100 for the first pass shows the readback signal being fed to the adaptive equalizer 1102. Prior to being processed by the adaptive equalizer 1102, as shown, or after being processed, the signal may be stored in a buffer 1118 or passed through to the interpolator 1104. The interpolator 1104 receives an output from the timing control 1114 loop, which utilizes decisions from the soft detector 1108. The output from the interpolator 1104 is sent to the gain adjustment 1106 for processing, then the soft detector 1108, followed by the soft decoder 1110, which produces the decoded data. The first pass decisions 1112 for the decoded data are stored, allowing them to be used in subsequent passes.

The subsequent pass read channel 1130 is similar to the first pass read channel 1100, except that the stored $(i-1)^{th}$ pass decisions 1116 are utilized by the timing control 1114, instead of the decisions from the soft detector 1108. In addition, the $i^{th}$ pass decisions 1112 are stored to a buffer, which in the next pass will become the $(i-1)^{th}$ pass decisions 1116.

The cycle slip detector 1120 is used to detect cycle slip, which may then be accounted for in the timing control 1114. The cycle slip detector 1120 uses information from the soft decoder 1110, along with some other information 1122. The other information 1122 may refer to timing-side information from other channels in a multi-channel recording system, according to one embodiment. Of course, any useful information may also be fed to the cycle slip detector 1120, as would be understood by one of skill in the art.

The cycle slip detector inserts one or more pointers indicating the positions where cycle slip occur. This information may then be used by the timing control 1114 algorithm to increase the robustness of the timing control mechanism in order to mitigate the occurrence of cycle slips at the indicated positions.

A number of approaches may be used to provide cycle slip detection in the cycle slip detector 1120. In one possible scheme, a real-time estimate of the actual sampling phase is obtained. The time evolution of the estimated timing phase is then tracked and a cycle slip occurrence declared when phase jump values are observed that are close to a multiple of the bit duration T. For example, for a $2^{nd}$ order PLL characterized by the constants $\zeta$ and $\gamma$, a real-time estimate of the actual sampling phase based on the Mueller-Muller (MM) timing function is derived according to the following equation:

$$\hat{\tau}_{k+1} = \hat{\tau}_k + \zeta \hat{\epsilon}_k + \gamma \Sigma_i \hat{\epsilon}_i$$

In this equation, $\hat{\epsilon}_k$ is the timing error estimate, and is obtained by evaluating $\hat{\epsilon}_k = z_k \hat{s}_{k-1} - z_{k-1} \hat{s}_k$, where $z_k$ is the signal sample at time k after timing recovery, and $\hat{s}_k$ is a slicer or sequence detector decision on the signal $z_k$. During the first pass, the estimates $\hat{s}_k$ are based on slicer decisions or (soft) detector decisions and during subsequent passes they are obtained from decoder decisions. That is to say, in the iterative read channel, at the $i^{th}$ iteration, $\hat{s}_k$ are based on decoder decisions obtained at iteration i−1.

For example, for an EPR4 channel, with the binary (hard) decisions provided by the decoder at the end of iteration i denoted as $\hat{a}_k$, the slicer or sequence detector decision $\hat{s}_k$ may be combined using the following equation.

$$\hat{s}_k = \hat{a}_k + \hat{a}_{k-1} - \hat{a}_{k-2} - \hat{a}_{k-3}$$

As one of skill in the art would understand, a hard decision value $\hat{s}_k$ may also be replaced by a soft decision value $\tilde{s}_k$. For example, for a soft decision value $\tilde{a}_k$ on the bit $a_k$, the soft decision $\tilde{s}_k$ may be combined using the following equation.

$$\tilde{s}_k = \tilde{a}_k + \tilde{a}_{k-1} - \tilde{a}_{k-2} - \tilde{a}_{k-3}$$

In this equation, the soft decision $\tilde{a}_k$ may be generated by a soft ECC decoder, or some other suitable decoder.

As mentioned above, abrupt changes in the value of the sampling phase estimate by integer multiples of T (T=symbol duration) are indicative of a cycle-slip event. Hence a pointer pointing to the approximate location of a cycle-slip event may be obtained by this approach.

Another approach to detect the occurrence of cycle slips exploits the error detection capability of the employed modulation code and/or ECC. Many frequent subsequent violations of the modulation constraints may be detected at the modulation decoder, and in this fashion a pointer may be generated to indicate a region where a cycle slip has occurred with high probability.

In one embodiment, a modulation code of the signal samples may be decoded subsequent to executing the detection algorithm and prior to executing the decoding algorithm of the ECC. Then, a modulation code may be encoded on the set of decisions provided by the decoder prior to executing the DFE functions thereon.

In a similar way, pointers to potential cycle slip regions may be generated from decoding failures of the ECC decoder. By flagging uncorrectable codewords, coarse pointers are obtained, which span over a relatively large region. Finer pointers, may be obtained by specifically designed LDPC codes.

For example, if an LDPC code is employed, the parity-check matrix of the code may be designed such that if a number of parity equations fail to check, an indication of the presence of a possible cycle slip may be derived. A pointer to the cycle-slip location may be obtained in this manner, or through some other method of determining a cycle-slip event. Although more refined techniques may be devised (e.g., using the information provided by multiple parity-check equations) to allow for a fairly accurate determination of the location of a cycle slip or cycle slips, this is not needed in the reiterated timing control for cycle slip mitigation scheme, where it is sufficient to approximately determine the location of cycle slips.

During the $2^{nd}$ and subsequent passes, the cycle-slip detection schemes are still applied. However, in addition, the read channel 1130 aims at eliminating any cycle slip event detected during the preceding pass. This specific operation may be implemented in various ways. For example, in one embodiment, the timing estimate driving the PLL during the time interval pointed to by the cycle-slip pointer may be held (updating is avoided). In another embodiment, global timing control may be employed and, during the cycle slip event, the PLL may be driven by timing information provided only by the channels for which good channel conditions are observed and no cycle slip occurred.

This iterative procedure is repeated as many times as needed or is allowed by the specific read channel implementation (or by some user setting which dictates a maximum number of iterations).

In the multi-channel case, when global timing control is applied, the timing information of two or more channels is combined to generate global timing information (e.g., a global frequency estimate), which may then be used by each individual channel. In this case, reiterated timing control may also be applied, namely, during the $i^{th}$ iteration, the timing information generated by each channel is decoder-decision based, and global timing information is similarly computed and distributed to every individual channel.

In the architecture shown in FIG. 11, ECC may be based on LDPC codes, a well-known family of powerful soft-decodable codes. When employed in the iterative read-channel architecture, LDPC decoding allows for improvement, at each iteration, of the reliability of decoded codewords. This also allows for improving the performance of the timing recovery loop. This scheme may eliminate the occurrence of cycle-slips by itself, provided that a sufficient number of read-channel iterations are performed.

However, when the read channel is also capable of detecting cycle slip events and mitigating them as described above, then the number of iterations needed to eliminate a cycle slip may be reduced drastically.

Figure 12:
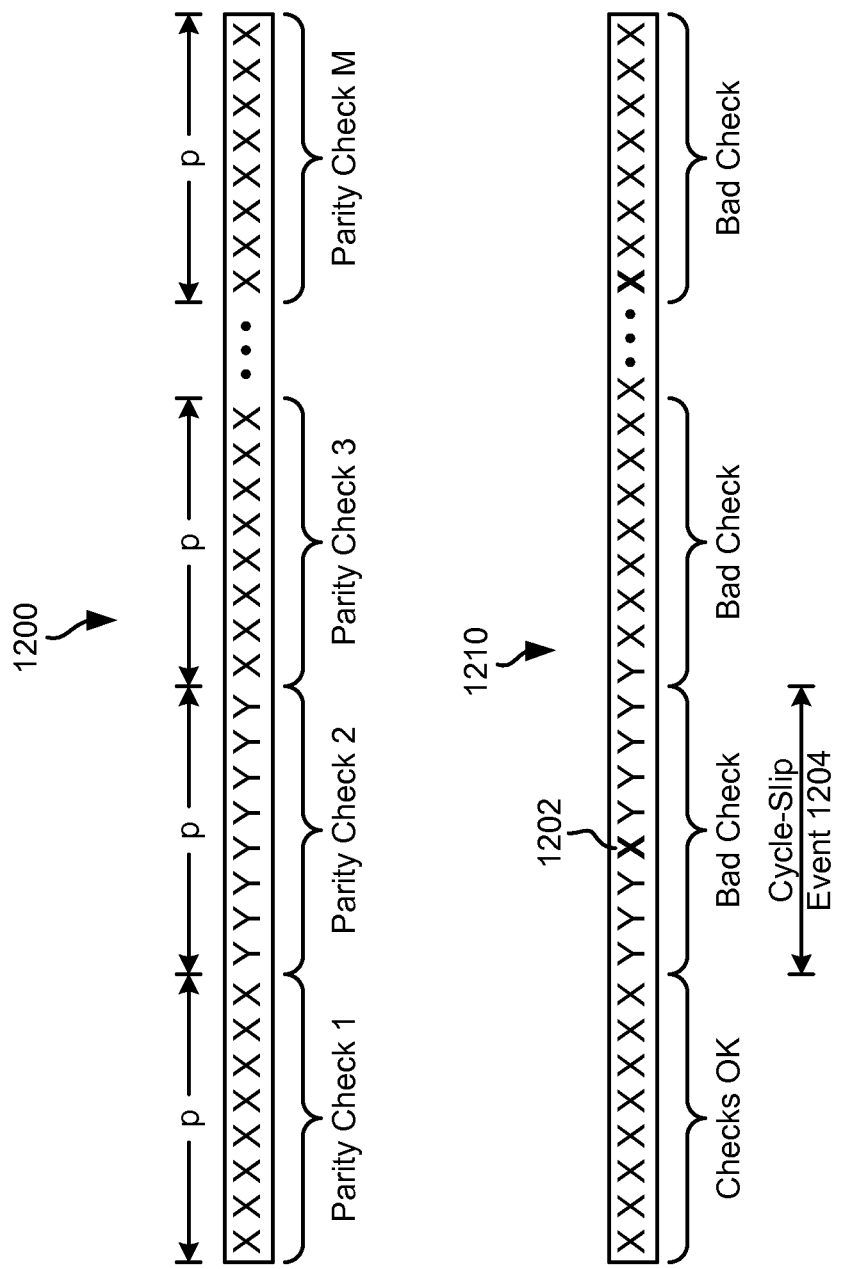
FIG. 12 is a diagram of a low density parity check (LDPC) design for cycle slip mitigation according to one embodiment.

Now referring to FIG. 12, LDPC design for cycle slip mitigation is shown according to one embodiment. One objective of LDPC is to determine the (approximate) position of a cycle-slip event 1204. This capability may be achieved by properly structuring the LDPC code parity check matrix, as LDPC code parity check matrix 1200 illustrates. Each parity check (Parity Check 1, Parity Check 2, . . . , Parity Check M) has a length of p bits. LDPC code parity check matrix 1200 shows no errors, with each parity checking out OK. However, in LDPC code parity check matrix 1210, assuming that no other errors have occurred, an insertion event 1202 has caused a parity check to come back bad. Because this is an insertion (as opposed to a deletion, which would follow similar methodology), the normal bits have shifted to the right, which results in Parity Check 2 checking out as bad. This causes a domino effect where each subsequent parity check also checking out as bad. In effect, an insertion/deletion event "splits" the detected codeword bits into two regions where, ideally, the parities check OK/check as BAD.

Cycle slip (possibly affecting multiple bits) must have occurred within an interval of length p. It is possible to determine whether the cycle slip was due to an insertion or a deletion, based on observed criteria.

The general form of a LDPC matrix which allows for cycle-slip detection has a majority of space used for a random or some other structure that is suitable for high performance usage, while some amount of the matrix is used for cycle slip detection.

Conventional systems attempt to detect and combat dropout events in one pass. This requires very fast dropout detection schemes which in turn make conventional schemes very unreliable. Combating dropout events based on reprocessing of the readback signal that is sampled at a fixed rate (asynchronous sampling), i.e., processing the sampled readback signal multiple times is a more effective method for combating dropout events.

In one embodiment, the following relationship may be used for dropout mitigation, Dropout Mitigation=(Dropout Detection during the first pass)+(Dropout Compensation during subsequent passes).

A RRFEC architecture allows reprocessing of blocks of sampled readback signals and therefore has the capability of acting many times on the sampled readback signal in order to mitigate dropout phenomena. Furthermore, the delay problem in the detection of dropouts described previously is avoided. Therefore, a first pass over the sampled readback signal may be devoted to the detection of dropout events, while subsequent passes may be directed toward mitigating and taking corrective actions against such events.

Therefore, in various embodiments, a receiver with a fixed-rate sampling (asynchronous sampling) may be employed where dropouts are detected in a first pass and corrective action using a bank of compensation filters is taken during subsequent passes.

One of the types of dropout events which may be mitigated includes dropouts attributed to basefilm/back-coat formulation of tape and asperities (surface roughness). The dropout occurrence frequency increases with linear density and shrinking of reader width, with dropout events possibly leading to error bursts at detector output, cycle slips, etc. Accordingly, maintaining symbol clock during dropout is a major challenge, with dropout detection and compensation needed in addition to cycle-slip mitigation techniques described previously.

Figure 13:
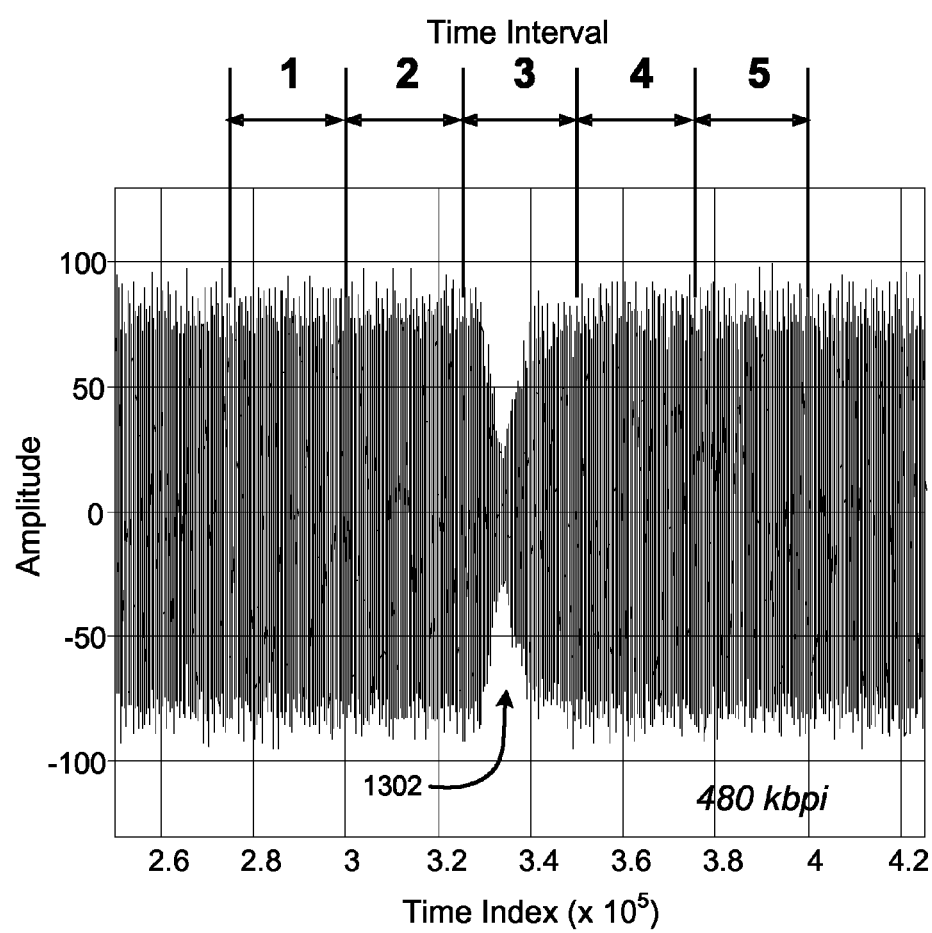
FIG. 13 is a graph showing dropout characterization for a magnetic tape channel.

Now referring to FIG. 13, dropout characterization for a magnetic tape channel is described. In FIG. 13, amplitude of an exemplary readback signal is shown versus a time index. The time index counts the number of T/5 time intervals where T is the symbol duration time. In the exemplary readback signal shown in FIG. 13, the signal dropout 1302 in the third time interval lasts for approximately 25000 (T/5)=5000 T bit intervals.

Figure 14:
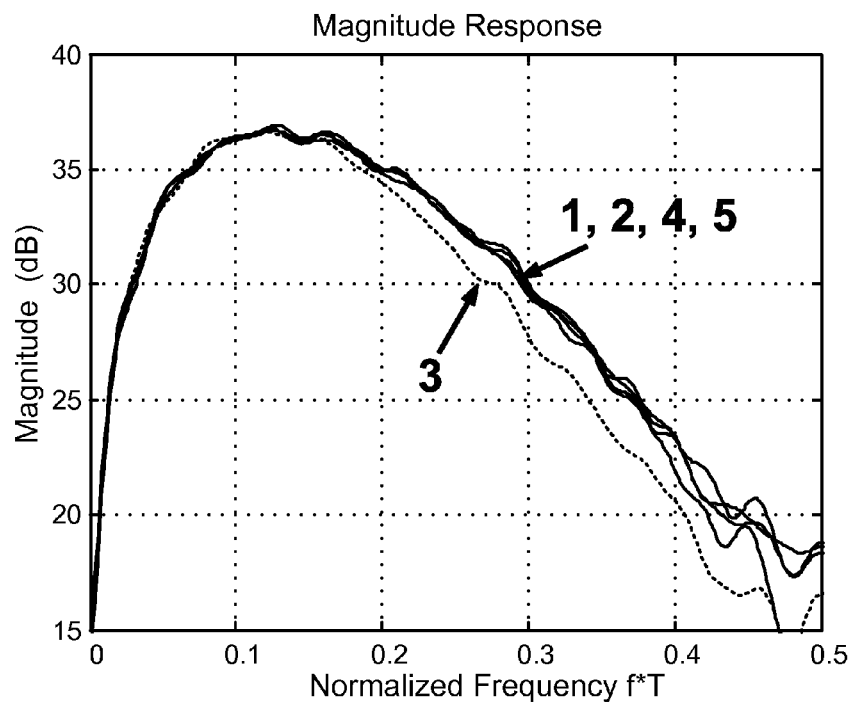
FIG. 14 is a plot showing magnitude response for the exemplary readback signal.

In FIG. 14, the magnitude response for the exemplary readback signal is shown. The magnitude in dB is shown versus the normalized frequency, which shows that for the 3$^{rd}$ time interval, the magnitude was measurably lower than for the other four time intervals (1, 2, 4, 5) which did not experience a dropout event. Therefore, dropout events like these are "frequency selective" in magnitude.

Figure 15:
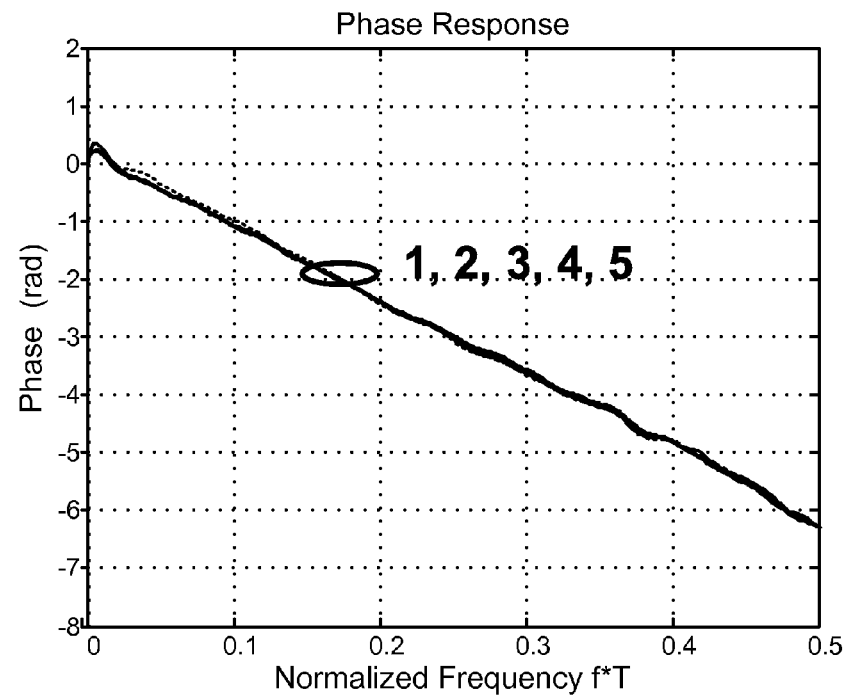
FIG. 15 is a plot showing phase response for the exemplary readback signal, according to one embodiment.

Furthermore, in FIG. 15, the phase response for the exemplary readback signal is shown. As can be seen, there is little noticeable difference between the 3$^{rd}$ time interval which experienced the dropout event and the other normal time intervals (1, 2, 4, 5).

Dropout modeling for magnetic tape channels may be provided at the output of the magnetic tape channel where the readback signal, γ(t), is output. In one embodiment, the model may be provided by the following equation.

$$\gamma(t) = \gamma(t)[\Sigma_k a_k h_k(t-kT-\tau_k) + n(t)]$$

In this equation, γ(t) is a time-varying gain which captures amplitude fading due to dropout, symbols $a_k$ are binary input symbols, $h_k(t-kT-\tau_k)$ is the received pulse, T is the symbol duration, n(t) is the total channel noise, and $\tau_k$ is the sampling phase. Note that dropouts are modeled by a time-varying gain factor γ(t) and also by time-varying channel responses $h_k(t)$. In other words, a dropout does not only cause a rapid fluctuation of signal gain, but also alters the channel response $h_k(t)$ as shown in connection with FIG. 14. This temporary change of the channel response characteristic may be viewed as a corresponding variation of the channel pulse-width (PW) at 50% amplitude of response to a change in magnetization (the so-called PW50/T parameter).

To combat the effects of a dropout, it is therefore useful to compensate variation in channel gain as well as in the channel transfer characteristic.

Figure 16:
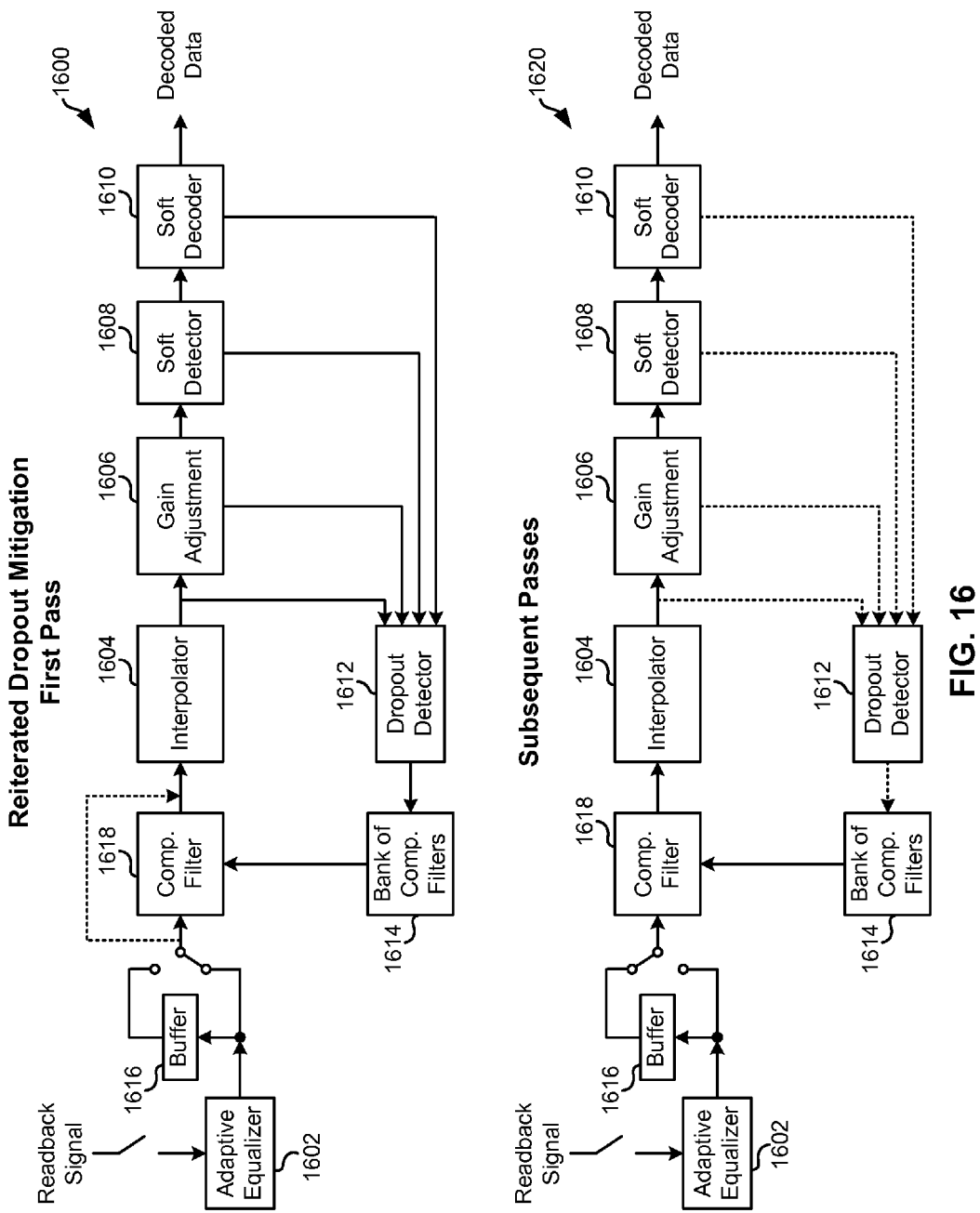
FIG. 16 shows a system for reiterated dropout mitigation, according to one embodiment.

Now referring to FIG. 16, architecture for a receiver with dropout mitigation is shown, according to one embodiment, for the first pass 1600 and subsequent passes 1620. During the first pass, the receiver 1600 operates in a "conventional" manner and dropout detection is performed by the dropout detector 1612, and a profile is computed based on any detected dropouts. Various approaches may be used to detect dropouts.

Some illustrative embodiments include: 1) a rectifier and envelope tracking circuit that detects large attenuations in the magnitude of the signal envelope, which are indicative of dropout events; 2) the gain value of a fast variable gain amplifier (VGA) gain circuit is monitored, where a sudden increase in the gain value is indicative of a dropout event; and 3) the reliability of the soft information computed in the soft detector and/or soft decoder is monitored, where a loss of reliability that is observed consistently over some time interval may indicate dropouts.

Other dropout detection techniques may also be used, as would be understood by one of skill in the art upon reading the present descriptions. It is beneficial to employ more than one dropout detection scheme in the dropout detector 1612 in order to increase the reliability of the dropout detection process, i.e., to minimize false-alarm and miss probabilities. Due to the iterative nature of the receiver, detection of dropouts does not need to happen within a short period of time; therefore, fairly reliable detection of signal dropouts may be achieved. As a result of dropout detection, a pointer to the dropout location is obtained. An accurate determination of the location of a dropout is not needed in this architecture, as it is sufficient to approximately determine the location of dropout events.

The readback signal may also be passed through an adaptive equalizer 1602, stored in a buffer 1616 for use in subsequent passes, passed through an interpolator 1604, have its gain adjusted in the gain adjustment module 1606, and processed by a soft detector 1608 and a soft decoder 1610. The output of each of the interpolator 1604, gain adjustment module 1606, the soft detector 1608, and the soft decoder 1610 may be used in the dropout detection performed by the dropout detector 1612. The dropout detector 1612 also computes dropout profiles and is adapted for classifying detected dropouts according to the dropout profiles in order to select a proper compensation filter.

In addition, in the first pass according to one embodiment, the compensation filter 1618 may be bypassed, as shown by the broken line bypassing the compensation filter 1618, because during the first pass, dropout detection in the dropout detector 1612 has not yet taken place. However, in other embodiments, the compensation filter 1618 may simply apply a default filter which does not significantly affect the signal samples (or have no effect at all).

During the second and all subsequent passes, the receiver 1620 aims at mitigating all dropout events detected during the first pass. This operation may be implemented in various ways. For example, in one embodiment, the readback signal is taken from the buffer 1616 and filtered by the compensation filter 1618 during the dropout event in order to compensate for the channel response being altered by the dropout. One or more compensation filters may be utilized in the compensation filter 1618, and which compensation filters are used may be selected as follows.

During an initial design phase, the dropout events are statistically characterized: each dropout has a specific signature or profile in terms of its duration, the time interval over which fading in signal amplitude occurs, and the time interval over which signal amplitude returns to nominal value. Based on these profiles, dropouts are classified in a number of groups (e.g., two, three, four, or more groups). For each group, a dropout compensation filter is computed. During real time operation of the read channel, when a dropout is detected, its profile is computed and it is determined to which group the specific dropout belongs. The compensation filter that was pre-computed for this group of dropouts is fetched from the bank of compensation filters 1614 (memory) and used in the compensation filter 1618 to filter the readback signal for the duration of the dropout. During the first pass 1600, the compensation filter 1618 may simply be bypassed.

An adaptive filter that operates in real time during the dropout event may also be used. Since the envelope profile of the dropout is known from the first pass, a fairly accurate compensation of the readback signal gain may also be achieved. Furthermore, erasures may be introduced for the duration of the dropout event to help the decoding process (e.g., LDPC decoding).

Decoder decisions may be used during second and subsequent passes to reiterate timing control, gain control, equalizer adaptation, and/or asymmetry cancellation (as described previously) in conjunction with dropout compensation.

In addition, data is usually both ECC-encoded and modulation-encoded before it is written to a storage medium. Therefore, receivers for storage channels (read channels) usually employ modulation decoders. Modulation decoders may be included before or after the ECC decoder as understood in the art.

The equalizer and the interpolator may be interchanged as described previously. Furthermore, dropout mitigation may also be performed within the framework of a multi-channel architecture with reiterated digital front-end control. Global timing control may also be used within the framework of a multi-channel architecture to recover timing information during the first and subsequent passes.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A computer program product for iterative read channel operation, the computer program product comprising a computer readable storage medium having program instructions embodied therewith, the program instructions executable by a controller to cause the controller to:
   store, by the controller, a block of signal samples to a memory, the signal samples being read from a magnetic tape;
   execute, by the controller, one or more digital front-end (DFE) functions on the block of signal samples employing a set of decisions provided by a detector executing a detection algorithm;
   execute, by the controller, a decoding algorithm of an error correcting code (ECC) on the signal samples using a decoder employing the set of decisions provided by the detector to generate a set of decisions provided by the decoder;
   store the signal samples, the set of decisions provided by the detector, and the set of decisions provided by the decoder; and
   in an iterative process until a maximum number of iterations has been reached or a valid codeword is produced:
      execute the one or more DFE functions on the signal samples employing the set of decisions provided by the decoder;
      execute the detection algorithm on the signal samples using the detector employing the set of decisions provided by the decoder to regenerate the set of decisions provided by the detector;
      execute the decoding algorithm of the ECC using the set of decisions provided by the detector to regenerate the set of decisions provided by the decoder;
      output decoding information relating to the signal samples when the decoding algorithm produces a valid codeword; and
      store the signal samples, the set of decisions provided by the detector, and the set of decisions provided by the decoder when the decoding algorithm does not produce a valid codeword.

2. The computer program product as recited in claim 1, wherein the detector is a soft detector which produces a set of soft decisions, and wherein the decoder is a soft decoder which produces a set of soft decisions.

3. The computer program product as recited in claim 2, wherein the decoding algorithm is a low-density parity-check (LDPC) algorithm that produces soft decisions.

4. The computer program product as recited in claim 2, wherein the program instructions are executable by the controller to cause the controller to:
   execute, by the controller, the detection algorithm using the soft detector and the decoding algorithm using the soft decoder for a predetermined number of iterations in an attempt to produce a valid codeword; and when a valid codeword is not produced after the predetermined number of iterations, the iterative process is restarted on the stored signal samples.

5. The computer program product as recited in claim 1, wherein the DFE functions include at least one of: interpolation, gain adjustment, asymmetry cancellation, and adaptive equalization, and wherein the decoding information relating to the signal samples includes at least: information bits, a number of erasures, and a location of erasures.

6. The computer program product as recited in claim 1, wherein the DFE functions are executed using decisions from the detector in a first pass, and decisions from the decoder on the signal samples of a previous pass in each subsequent pass.

7. The computer program product as recited in claim 6, wherein the program instructions are executable by the controller to cause the controller to:
   decode, by the controller, a modulation code of the signal samples subsequent to executing the detection algorithm and prior to executing the decoding algorithm of the ECC; and
   encode, by the controller, a modulation code on the set of decisions provided by the decoder prior to executing the DFE functions thereon.

8. The computer program product as recited in claim 1, wherein the iterative process further comprises decoding a modulation code of the signal samples prior to outputting the decoding information relating to the signal samples.

9. A computer program product for iterative read channel operation, the computer program product comprising a computer readable storage medium having program instructions embodied therewith, the program instructions executable by a controller to cause the controller to:
   in an iterative process until a maximum number of iterations has been reached or a valid codeword is produced:
      execute, by the controller, one or more digital front-end (DFE) functions on a plurality of signal samples employing a set of decisions provided by a decoder;
      execute, by the controller, a detection algorithm on the signal samples using a detector employing the set of decisions provided by the decoder to regenerate a set of decisions provided by a detector;
      execute, by the controller, a decoding algorithm of an error correcting code (ECC) using the set of decisions provided by the detector to regenerate the set of decisions provided by the decoder; and
   output, by the controller, decoding information relating to the signal samples when the decoding algorithm produces a valid codeword.

10. The computer program product as recited in claim 9, wherein the program instructions are executable by the controller to cause the controller to store, by the controller, the plurality of signal samples to a memory prior to executing the DFE functions thereon, the signal samples being read from a magnetic tape.

11. The computer program product as recited in claim 9, wherein the program instructions are executable by the controller to cause the controller to store, by the controller, the signal samples, the set of decisions provided by the detector, and the set of decisions provided by the decoder when the decoding algorithm does not produce a valid codeword.

12. The computer program product as recited in claim 11, wherein the detector is a soft detector which produces a set of soft decisions, and wherein the decoder is a soft decoder which produces a set of soft decisions, wherein the program instructions are executable by the controller to cause the controller to:
   execute, by the controller, the detection algorithm using the soft detector and the decoding algorithm using the soft decoder for a predetermined number of iterations in an attempt to produce a valid codeword; and
   when a valid codeword is not produced after the predetermined number of iterations, the iterative process is restarted on the stored signal samples.

13. The computer program product as recited in claim 9, wherein the detector is a soft detector which produces a set of soft decisions, and wherein the decoder is a soft decoder which produces a set of soft decisions.

14. The computer program product as recited in claim 13, wherein the decoding algorithm is a low-density parity-check (LDPC) algorithm that produces soft decisions.

15. The computer program product as recited in claim 9, wherein the DFE functions include at least one of: interpolation, gain adjustment, asymmetry cancellation, and adaptive equalization, and wherein the decoding information relating to the signal samples includes at least: information bits, a number of erasures, and a location of erasures.

16. The computer program product as recited in claim 9, wherein the DFE functions are executed using decisions from the detector in a first pass, and decisions from the decoder on the signal samples of a previous pass in each subsequent pass.

17. The computer program product as recited in claim 16, wherein the program instructions are executable by the controller to cause the controller to:
   decode, by the controller, a modulation code of the signal samples subsequent to executing the detection algorithm and prior to executing the decoding algorithm of the ECC; and
   encode, by the controller, a modulation code on the set of decisions provided by the decoder prior to executing the DFE functions thereon.

18. The computer program product as recited in claim 9, wherein the iterative process further comprises decoding a modulation code of the signal samples prior to outputting the decoding information relating to the signal samples.

* * * * *